US008854525B2

(12) United States Patent
Imamura

(10) Patent No.: US 8,854,525 B2
(45) Date of Patent: Oct. 7, 2014

(54) IMAGING DEVICE, IMAGING SYSTEM, AND IMAGING METHOD

(71) Applicant: Panasonic Corporation, Osaka (JP)

(72) Inventor: Norihiro Imamura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/189,190

(22) Filed: Feb. 25, 2014

(65) Prior Publication Data

US 2014/0168490 A1    Jun. 19, 2014

Related U.S. Application Data

(63) Continuation of application No. 13/519,627, filed as application No. PCT/JP2011/006093 on Oct. 31, 2011.

(30) Foreign Application Priority Data

Apr. 22, 2011    (JP) .................. 2011-095742

(51) Int. Cl.
H04N 5/225    (2006.01)
G03B 33/00    (2006.01)
H04N 5/369    (2011.01)
H01L 27/146    (2006.01)
G02B 27/12    (2006.01)
H04N 9/04    (2006.01)
G03B 11/00    (2006.01)
G02B 27/10    (2006.01)

(52) U.S. Cl.
CPC .......... H01L 27/14625 (2013.01); G03B 33/00 (2013.01); H04N 5/3696 (2013.01); H04N 5/2254 (2013.01); G02B 27/123 (2013.01); H04N 9/045 (2013.01); G03B 11/00 (2013.01); G02B 27/1013 (2013.01)
USPC ....................................... 348/335

(58) Field of Classification Search
USPC ........................................ 348/335
See application file for complete search history.

(56) References Cited

U.S. PATENT DOCUMENTS 4,230,941 A    10/1980 Stauffer
4,318,123 A    3/1982 Knop
5,600,486 A    2/1997 Gal et al.
(Continued)

FOREIGN PATENT DOCUMENTS

EP    2 065 743 A1    6/2009
EP    2 495 540 A2    9/2012
(Continued)

OTHER PUBLICATIONS

Co-pending U.S. Appl. No. 13/519,627, filed Jun. 28, 2012.
(Continued)

Primary Examiner — James Hannett
(74) Attorney, Agent, or Firm — Renner, Otto, Boisselle & Sklar, LLP

(57) ABSTRACT

An imaging apparatus of the present invention includes: a lens optical system including a lens and a stop; an imaging device including at least a plurality of first pixels and a plurality of second pixels on which light having passed through the lens optical system is incident; and an arrayed optical device arranged between the lens optical system and the imaging device, wherein: the lens optical system includes, in a plane vertical to an optical axis, a first area that transmits therethrough light of a first wavelength band and a second area that transmits therethrough light of a second wavelength band different from the first wavelength band; and the arrayed optical device makes light having passed through the first area incident on the plurality of first pixels and light having passed through the second area incident on the plurality of second pixels.

21 Claims, 23 Drawing Sheets

(56) References Cited

U.S. PATENT DOCUMENTS

| | | | |
|---|---|---|---|
| 7,242,478 B1 | 7/2007 | Dombrowski et al. | |
| 7,427,742 B2 * | 9/2008 | Drowley et al. | 250/216 |
| 7,433,042 B1 * | 10/2008 | Cavanaugh et al. | 356/419 |
| 8,427,548 B2 * | 4/2013 | Lim et al. | 348/222.1 |
| 2001/0017649 A1 | 8/2001 | Yaron | |
| 2005/0073603 A1 | 4/2005 | Feldman et al. | |
| 2005/0124858 A1 | 6/2005 | Matsuzawa et al. | |
| 2006/0082726 A1 | 4/2006 | Suzuki | |
| 2006/0124833 A1 | 6/2006 | Toda | |
| 2008/0266655 A1 | 10/2008 | Levoy et al. | |
| 2009/0027542 A1 | 1/2009 | Yamamoto et al. | |
| 2009/0135282 A1 | 5/2009 | Gidon | |
| 2010/0267163 A1 | 10/2010 | Ran et al. | |
| 2010/0283863 A1 | 11/2010 | Yamamoto | |
| 2010/0283884 A1 | 11/2010 | Hayasaka et al. | |
| 2010/0328780 A1 * | 12/2010 | Tocci | 359/636 |
| 2011/0073752 A1 | 3/2011 | Berkner et al. | |
| 2012/0182438 A1 | 7/2012 | Berkner et al. | |
| 2012/0226480 A1 * | 9/2012 | Berkner et al. | 703/1 |

FOREIGN PATENT DOCUMENTS

| | | |
|---|---|---|
| GB | 2 092 330 A | 8/1982 |
| JP | 59-002012 B2 | 1/1984 |
| JP | 11-344662 A | 12/1999 |
| JP | 2001-174696 A | 6/2001 |
| JP | 2002-135796 A | 5/2002 |
| JP | 2003-523646 T | 8/2003 |
| JP | 2006-190958 A | 7/2006 |
| JP | 2007-520166 T | 7/2007 |
| JP | 4253550 B2 | 1/2009 |
| JP | 2010-212306 A | 9/2010 |
| WO | WO 2007/044725 A2 | 4/2007 |
| WO | WO 2012/066741 A1 | 5/2012 |

OTHER PUBLICATIONS

International Search Report for corresponding International Application No. PCT/JP2011/006093 mailed Jan. 17, 2012.

Form PCT/ISA/237 for corresponding International Application No. PCT/JP2011/006093 dated Jan. 17, 2012.

Supplementary European Search Report for corresponding European Application No. 11852202.8 dated Mar. 7, 2013.

Official Communication for corresponding European Application No. 11 852 202.8 issued Jun. 16, 2014.

* cited by examiner

*FIG.13*
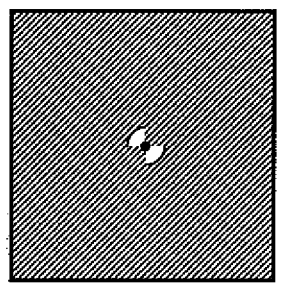
(a1)
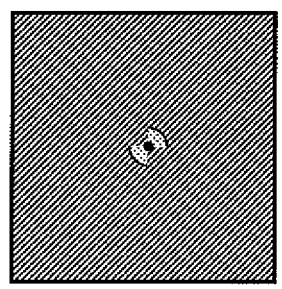
(a2)
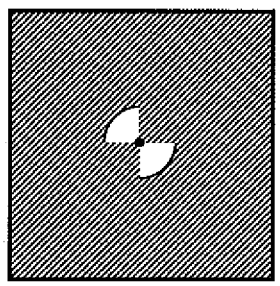
(b1)
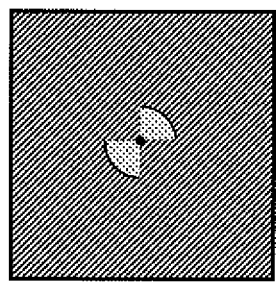
(b2)
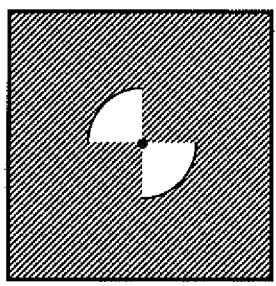
(c1)
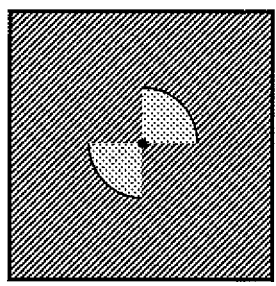
(c2)

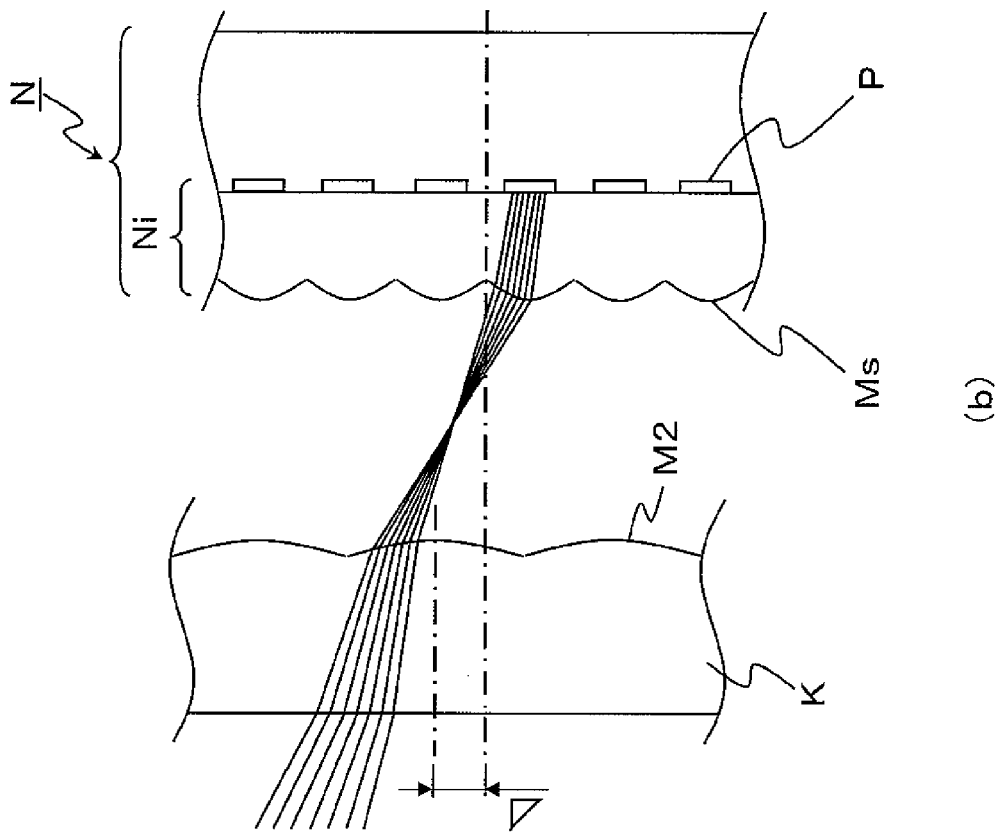
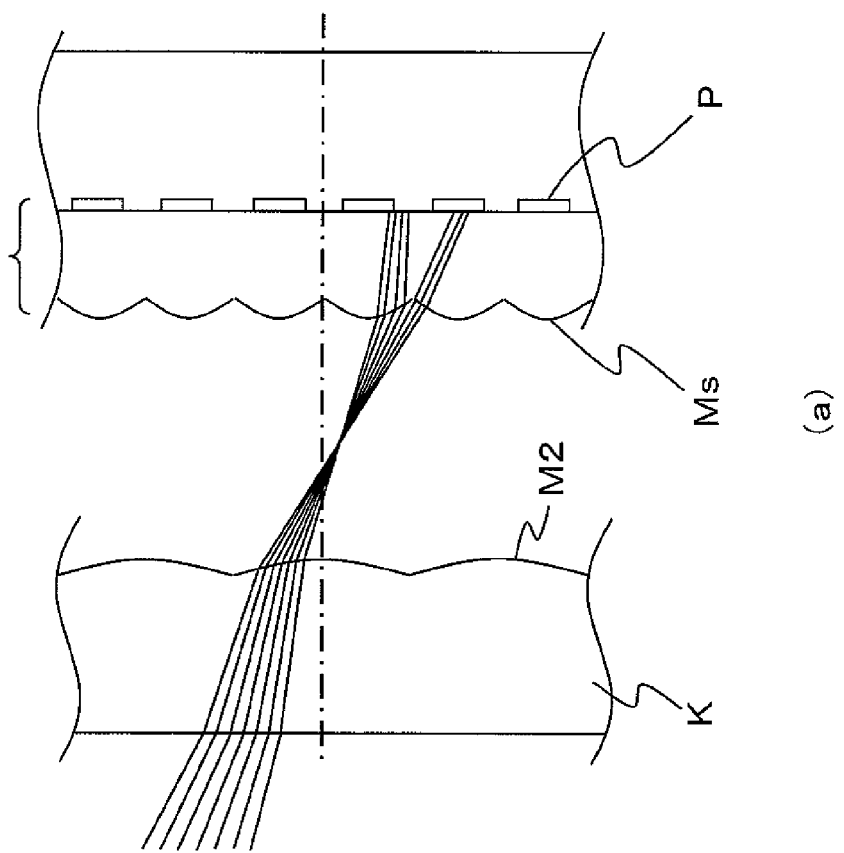
FIG. 24

IMAGING DEVICE, IMAGING SYSTEM, AND IMAGING METHOD

TECHNICAL FIELD

The present invention relates to an imaging apparatus such as a camera.

BACKGROUND ART

A color filter using an organic material such as a pigment or a dye is typically formed on each pixel of a solid-state imaging device for color imaging. Since such a color filter allows infrared light to pass therethrough, an infrared cut filter is typically arranged along the optical path upstream of the solid-state imaging device in order to obtain a desirable color image with an imaging apparatus. Therefore, with an imaging apparatus using a single imaging device, it is difficult to simultaneously obtain both image information of visible light and that of infrared light. A color filter using an organic material has a wide wavelength band and the wavelength bands of blue, green and red overlap with one another over relatively wide wavelength bands, for example, thereby deteriorating the color reproducibility.

In view of this, in order to solve these problems, techniques have been disclosed which relate to a solid-state imaging device in which a color filter of a dielectric multi-layer film is formed (Patent Documents 1 and 2).

With a color filter using an organic material, it is difficult to form narrow-band spectral characteristics, and it is difficult to capture an image by extracting color information of narrow wavelength bands.

In view of this, a technique has been disclosed for obtaining an image by successively turning on white light and predetermined narrow-band light in order to obtain color information of narrow bands (Patent Document 3).

CITATION LIST

Patent Literature

Patent Document No. 1: Japanese Laid-Open Patent Publication No. 2010-212306
Patent Document No. 2: Japanese Laid-Open Patent Publication No. 2006-190958
Patent Document No. 3: Japanese Patent No. 4253550

SUMMARY OF INVENTION

Technical Problem

With Documents 1 and 2, since a step of forming a dielectric multi-layer film for each of minute pixels is needed, the solid-state imaging device will be expensive. Moreover, the formation is difficult with very minute pixel sizes.

Document 3 is a scheme in which an image is captured in a time division method by successively turning on white light source and predetermined narrow-band light source. Therefore, when capturing an image of a moving object, a color shift occurs due to time difference.

Since the spectral characteristics of conventional color imaging devices are typically standardized for each model in view of the productivity, it is difficult for imaging apparatus manufacturers, who buy them, to arbitrarily specify the spectral characteristics.

The present invention has been made in order to solve the problems set forth above, and a primary object thereof is to provide an imaging apparatus and an imaging method, with which it is possible to obtain any multispectral image through a single imaging operation using a single imaging optical system. A multispectral image refers to an image having spectral information for each pixel.

Solution to Problem

An imaging apparatus of the present invention includes: a lens optical system including a lens and a stop; an imaging device including at least a plurality of first pixels and a plurality of second pixels on which light having passed through the lens optical system is incident; and an arrayed optical device arranged between the lens optical system and the imaging device, wherein the lens optical system further includes a plurality of optical areas in a plane vertical to an optical axis; the plurality of optical areas include a first optical area that transmits therethrough light of a first wavelength band, and a second optical area that transmits therethrough light of a second wavelength band different from the first wavelength band; and the arrayed optical device makes light having passed through the first optical area incident on the plurality of first pixels and light having passed through the second optical area incident on the plurality of second pixels.

An imaging system of the present invention includes: an imaging apparatus of the present invention; and a signal processing device for generating first image information corresponding to the first wavelength band from pixel values obtained from the plurality of first pixels of the imaging apparatus, and generating second image information corresponding to the second wavelength band from pixel values obtained from the plurality of second pixels.

An imaging method of the present invention uses an imaging apparatus including: a lens optical system including at least a first optical area that transmits therethrough light of a first wavelength band, and a second optical area that transmits therethrough light of a second wavelength band different from the first wavelength band; an imaging device including at least a plurality of first pixels and a plurality of second pixels on which light having passed through the lens optical system is incident; and an arrayed optical device arranged between the lens optical system and the imaging device, wherein: the arrayed optical device makes light having passed through the first optical area incident on the plurality of first pixels and light having passed through the second optical area incident on the plurality of second pixels; and a first image corresponding to the first wavelength band is generated from pixel values obtained from the plurality of first pixels, and second image information corresponding to the second wavelength band is generated from pixel values obtained from the plurality of second pixels.

Advantageous Effects of Invention

According to the present invention, it is possible to obtain any multispectral image through a single imaging operation using a single imaging system. According to the present invention, there is no need to provide a dielectric multi-layer film for each pixel. When a motion video is taken using the imaging apparatus of the present invention, no image shift will occur between a plurality of images even if the position of the object changes over time.

BRIEF DESCRIPTION OF DRAWINGS

FIG. 13 Diagrams illustrating point images and centroids thereof for different object distances in Embodiment 4 of the present invention.

FIGS. 24 (a) and (b) are enlarged views of the arrayed optical device K and the imaging device N in other embodiments of the present invention.

DESCRIPTION OF EMBODIMENTS

Embodiments of the imaging apparatus of the present invention will now be described with reference to the drawings.

Embodiment 1

Figure 1:
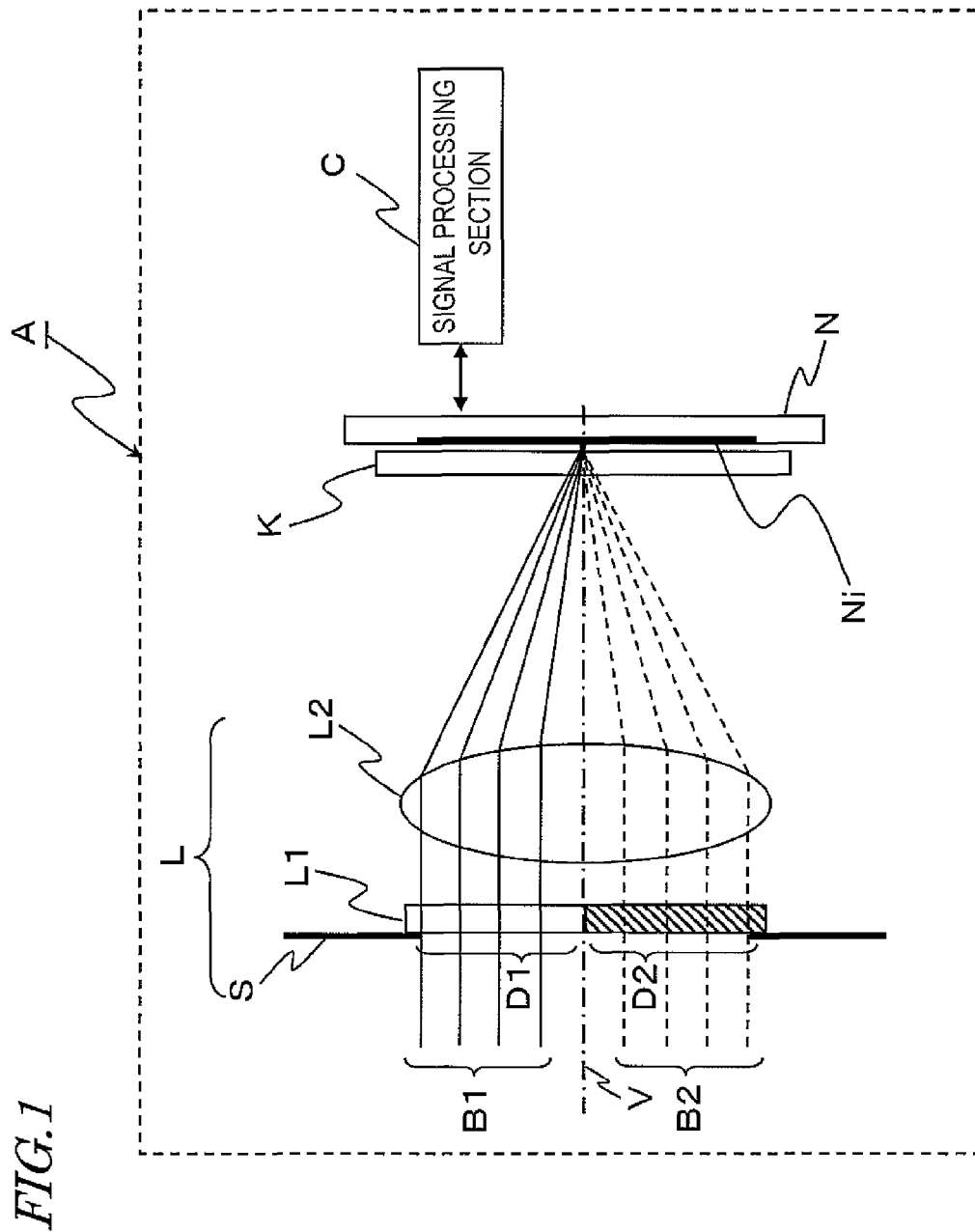
FIG. 1 A schematic diagram showing Embodiment 1 of an imaging apparatus A of the present invention.

FIG. 1 is a schematic diagram showing an imaging apparatus A of Embodiment 1. The imaging apparatus A of the present embodiment includes a lens optical system L whose optical axis is V, an arrayed optical device K arranged in the vicinity of the focal point of the lens optical system L, an imaging device N, and a signal processing section C.

The lens optical system L includes a stop S on which light from an object (not shown) is incident, an optical device L1 on which light having passed through the stop S is incident, and a lens L2 on which light having passed through the optical device L1 is incident.

The lens L2 may be formed by a single lens or a plurality of lenses. FIG. 1 shows a single-lens configuration.

The optical device L1 is arranged in the vicinity of the stop.

The optical device L1 has a first optical area D1 that transmits therethrough light of a first wavelength band, and a second optical area D2 that transmits therethrough light of a second wavelength band. The first wavelength band and the second wavelength band are different from each other.

The "wavelength band", as in the "first wavelength band" and the "second wavelength band", is for example a continuous band that accounts for 50% or more of the total amount of light passing through the area, and any wavelength 95% or more of which is cut off passing through the area is not included in the "wavelength band".

Two wavelength bands being different from each other means that at least one of the wavelength bands includes a band that is not included in the other wavelength band. Therefore, the wavelength bands may partially overlap each other.

A configuration where different wavelength bands are transmitted is realized by a configuration where a filter using an organic material or a dielectric multi-layer film is formed on one surface of the optical device L1 that is closer to the stop S, a configuration in which an absorption-type filter is formed, or a configuration in which each area of the optical device L1 is colored by a dye-type filter. Such color filters may be formed on a single flat plate or may be formed on a plurality of flat plates separated from one another for different areas.

In the present embodiment, light having passed through the two optical areas D1 and D2 are incident on the arrayed optical device K after passing through the lens L2. The arrayed optical device K makes light having passed through the optical area D1 incident on pixels P1 of the imaging device N, and makes light having passed through the optical area D2 incident on pixels P2 of the imaging device N. The signal processing section C generates image information corresponding to the first wavelength band from pixel values obtained on the pixels P1, and generates image information corresponding to the second wavelength band from pixel values obtained on the pixels P2, to output the image information.

In FIG. 1, a light beam B1 is a light beam passing through the optical area D1 on the optical device L1, and a light beam B2 is a light beam passing through the optical area D2 on the optical device L1. The light beams B1 and B2 pass through the stop S, the optical device L1, the lens L2 and the arrayed optical device K in this order to arrive at an imaging surface Ni on the imaging device N.

Figure 2:
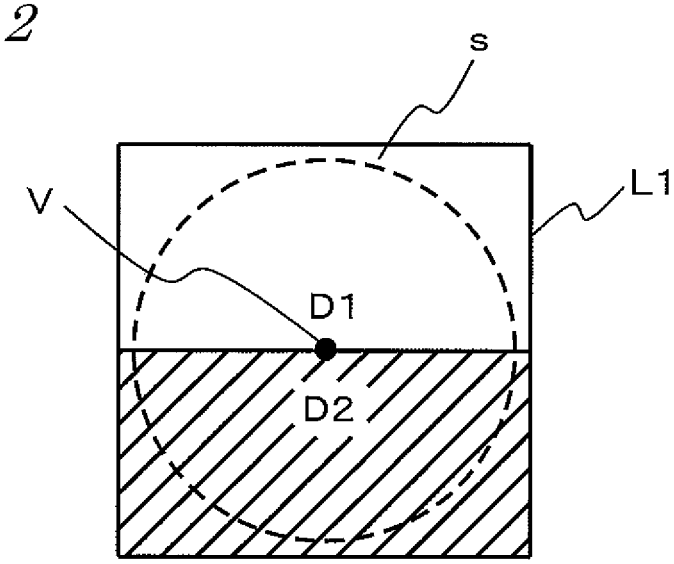
FIG. 2 A front view of an optical device L1 in Embodiment 1 of the present invention as seen from the object side.

FIG. 2 is a front view of the optical device L1 as seen from the object side. The optical areas D1 and D2 of the optical device L1 are formed by two-fold division in the up-down direction in a plane vertical to the optical axis V with the optical axis V being the center of the boundary. In FIG. 2, the broken line s represents the position of the stop S.

Figure 3:
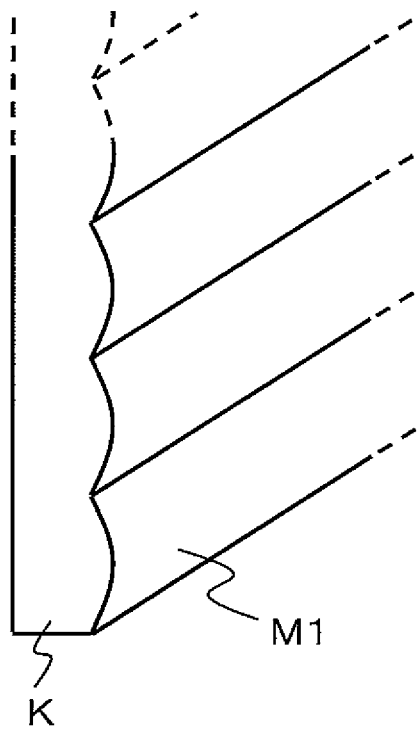
FIG. 3 A perspective view of an arrayed optical device K in Embodiment 1 of the present invention.

FIG. 3 is a perspective view of the arrayed optical device K. A plurality of optical elements M1 elongated in the horizontal direction are arranged in the vertical direction on one surface of the arrayed optical device K that is closer to the imaging device N. The cross section (in the vertical direction) of each optical element M1 has a curved shape protruding toward the imaging device N. Thus, the arrayed optical device K has a lenticular lens configuration.

As shown in FIG. 1, the arrayed optical device K is arranged in the vicinity of the focal point of the lens optical system L, and is arranged at a position at a predetermined distance from the imaging surface Ni.

Figure 4:
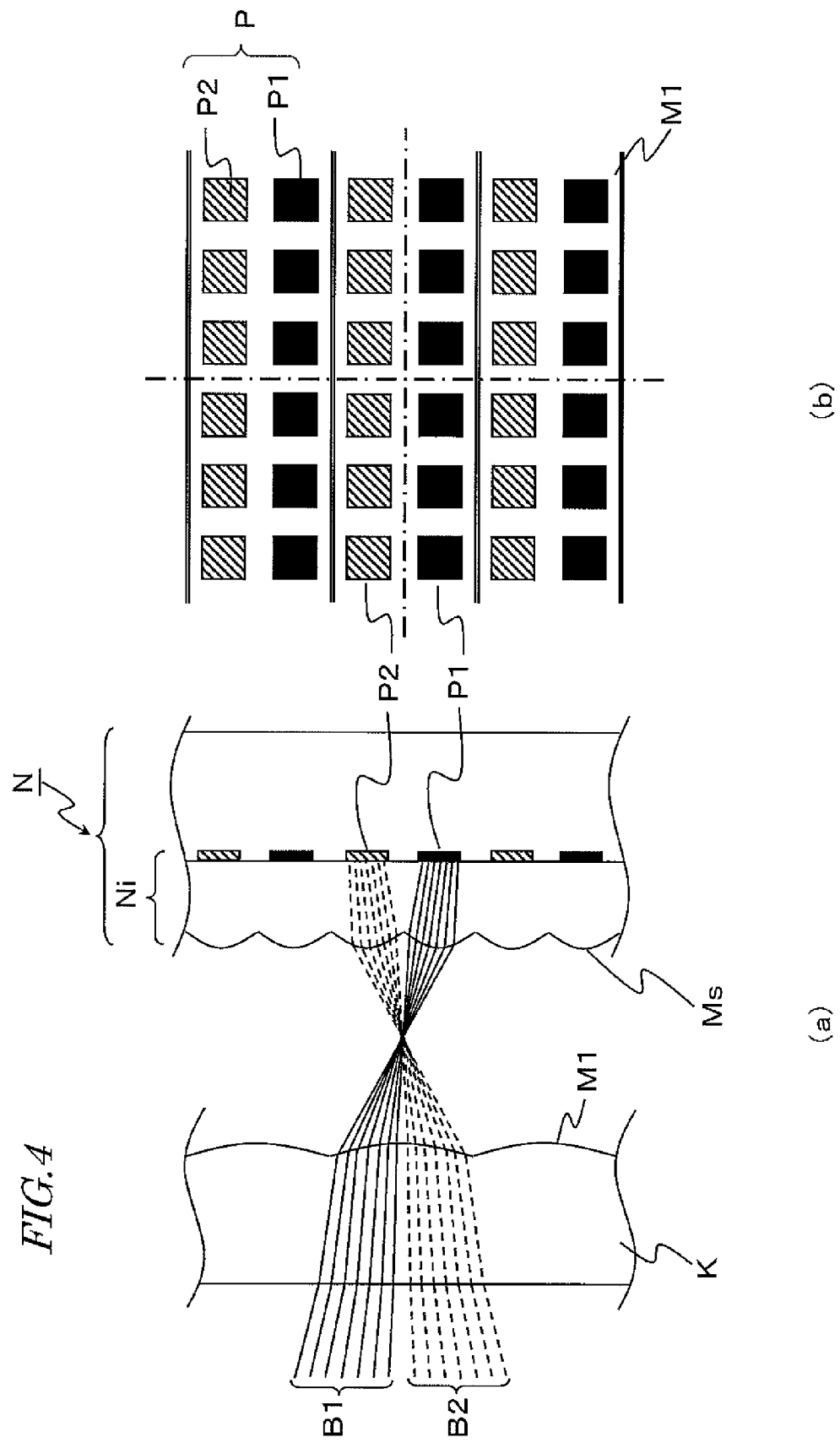
FIG. 4 (a) is an enlarged view of the arrayed optical device K and an imaging device N of Embodiment 1 shown in FIG. 1, and (b) is a diagram showing the positional relationship between the arrayed optical device K and pixels of the imaging device N.

FIG. 4(a) is an enlarged view of the arrayed optical device K and the imaging device N shown in FIG. 1, and FIG. 4(b) is a diagram showing the positional relationship between the arrayed optical device K and pixels on the imaging device N. The arrayed optical device K is arranged so that the surface on which the optical elements M1 are formed faces the imaging surface Ni. The pixels P are arranged in a matrix pattern on the imaging surface Ni. The pixels P can be grouped into pixels P1 and pixels P2.

The pixels P1 and the pixels P2 are arranged in rows in the horizontal direction (row direction). In the vertical direction (column direction), the pixels P1 and P2 are arranged alternating with each other. The arrayed optical device K is arranged so that each optical element M1 thereof corresponds to two rows of pixels including one row or pixels P1 and one row of pixels P2 on the imaging surface Ni. Microlenses Ms are provided on the imaging surface Ni so as to cover the surface of the pixels P1 and P2.

The arrayed optical device K is designed so that the majority of the light beam (the light beam B1 represented by solid lines in FIG. 1) having passed through the optical area D1 on the optical device L1 (shown in FIG. 1 and FIG. 2) arrives at the pixels P1 on the imaging surface Ni, and the majority of the light beam (the light beam B2 represented by broken lines in FIG. 1) having passed through the optical area D2 arrives at the pixels P2 on the imaging surface Ni. Specifically, the configuration described above is realized by appropriately setting parameters such as the refractive index of the arrayed optical device K, the distance from the imaging surface Ni, and the radius of curvature at the surface of the optical element M1.

Where the imaging optical system is an image-side non-telecentric optical system, the angle of a light beam at the focal point is determined by the position of the light beam passing through the stop and the angle thereof with respect to the optical axis. The arrayed optical device has a function of differentiating the exit direction depending on the incident angle of the light beam. Therefore, by arranging the optical areas D1 and D2 in the vicinity of the stop and arranging the arrayed optical device K in the vicinity of the focal point as described above, the light beams B1 and B2 having passed through the respective optical areas can be separately guided to the pixels P1 and P2, respectively. If the position where the optical areas D1 and D2 are arranged is significantly away from the position of the stop, light having passed through the optical area D1 and light having passed through the optical area D2 cannot be separated to the pixels P1 and the pixels P2, respectively, resulting in a large amount of crosstalk. Where the imaging optical system is an image-side telecentric optical system, since light beams passing through the stop are parallel, the angle of a light beam at the focal point is uniquely determined by the position of the light beam passing through the stop.

With such a configuration, the pixels P1 and the pixels P2 generate image information corresponding to light of different wavelength bands from each other. That is, the imaging apparatus A is capable of obtaining a plurality of image information formed by light of different wavelength bands from each other through a single imaging operation using a single imaging optical system.

Specific examples of the first wavelength band and the second wavelength band will be shown.

In one example, the first optical area D1 is an optical filter having characteristics such that visible light is transmitted therethrough as light of the first wavelength band while near infrared light is substantially blocked. The second optical area D2 is an optical filter having characteristics such that visible light is substantially blocked while near infrared light is transmitted therethrough as light of the second wavelength band. Thus, it is possible to realize an imaging apparatus for day and night use or an imaging apparatus for biometric authentication. With such an imaging apparatus, when obtaining an image of near infrared light, it is preferred to provide a light source having spectral radiation characteristics including the band of near infrared light.

In another example, the first optical area D1 is an optical filter having characteristics such that visible light is transmitted therethrough as light of the first wavelength band while near ultraviolet light is substantially blocked. The second optical area D2 is an optical filter having characteristics such that visible light is substantially blocked while near ultraviolet light is transmitted therethrough as light of the second wavelength band. Thus, it is possible to realize an imaging apparatus for visualizing conditions of the skin such as blotches due to near ultraviolet rays. With such an imaging apparatus, when obtaining an image of near ultraviolet light, it is preferred to provide a light source having spectral radiation characteristics including the band of near ultraviolet light.

In another example, the first optical area D1 is an optical filter that transmits therethrough light of a predetermined wavelength band width, and the second optical area D2 is an optical filter that transmits therethrough light of a narrower band width than the predetermined wavelength band width. That is, the width of the first wavelength band is made narrower than the width of the second wavelength band. Thus, it is possible to realize an imaging apparatus for endoscope or capsule endoscope applications with which it is possible to observe lesions with a narrow band. In this example, the second wavelength band may or may not be included in the first wavelength band. With such an imaging apparatus, it is preferred to provide one type of a light source having spectral radiation characteristics including the first and second wavelength bands, or a plurality of types of light sources having spectral radiation characteristics corresponding respectively to the first and second wavelength bands. In such an application, it is possible to easily distinguish a lesion by displaying on a monitor the image obtained with a wide band and the image obtained with a narrow band in different colors from each other.

In the present embodiment, the pixel value is missing for every other pixel in the y direction. Therefore, the pixel value of the pixel for which it is missing may be generated by interpolation with pixel values of pixels adjacent thereto in the y direction, or pixel values in the x direction may be added together in groups of two pixels.

A configuration may be used where the aspect ratio between the x direction and the y direction of each pixel of the imaging device is 2:1. With such a configuration, the interpolation process or the addition process as described above will be unnecessary.

Embodiment 2

Embodiment 2 is different from Embodiment 1 in that the area of the optical device L1 is divided in three. Herein, what is substantially the same as Embodiment 1 will not be described in detail.

Figure 5:
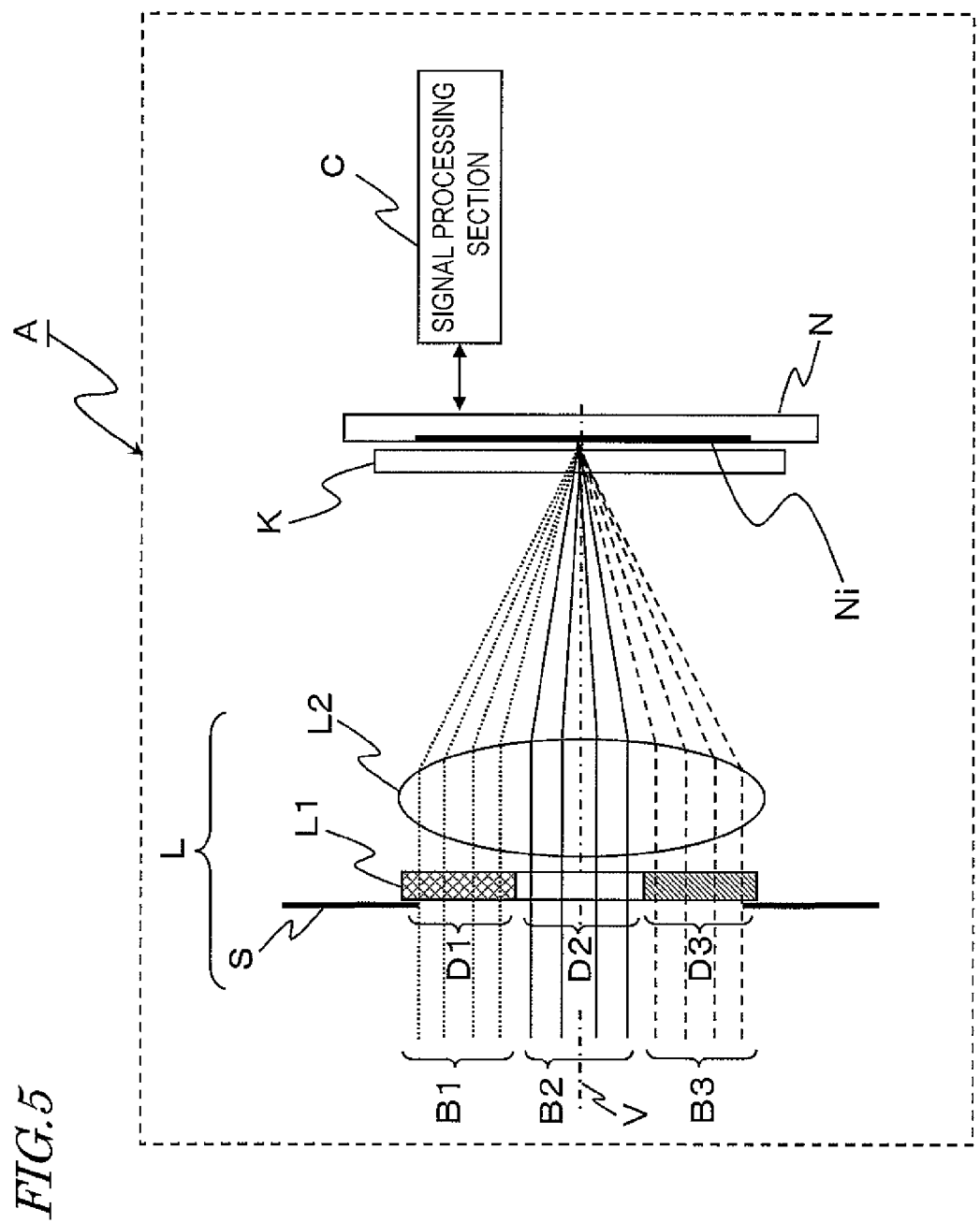
FIG. 5 A schematic diagram showing Embodiment 2 of the imaging apparatus A of the present invention.

FIG. 5 is a schematic diagram showing the imaging apparatus A of Embodiment 2.

In FIG. 5, the light beam B1 is a light beam passing through the optical area D1 on the optical device L1, the light beam B2 is a light beam passing through the optical area D2 on the optical device L1, and a light beam B3 is a light beam passing through the optical area D3 on the optical device L1. The light beams B1, B2 and B3 pass through the stop S, the optical device L1, the lens L2 and the arrayed optical device K in this order to arrive at the imaging surface Ni (shown in FIG. 7, etc.) on the imaging device N.

Figure 6:
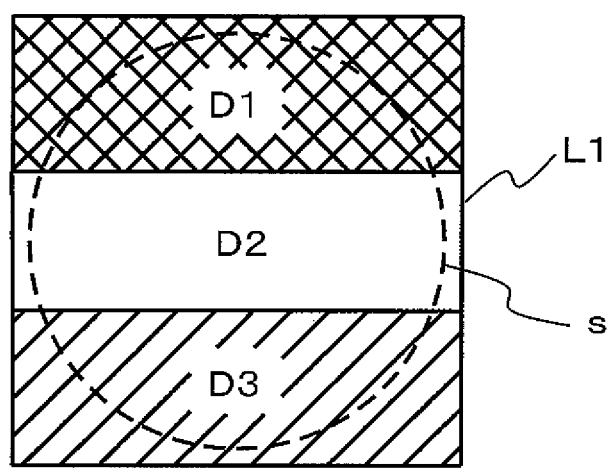
FIG. 6 A front view of the optical device L1 in Embodiment 2 of the present invention as seen from the object side.

FIG. 6 is a front view of the optical device L1 as seen from the object side, and the optical areas D1, D2 and D3 are formed by three-fold division in the up-down direction in a plane vertical to the optical axis V. The wavelength bands of light passing through different optical areas are different from each other.

Figure 7:
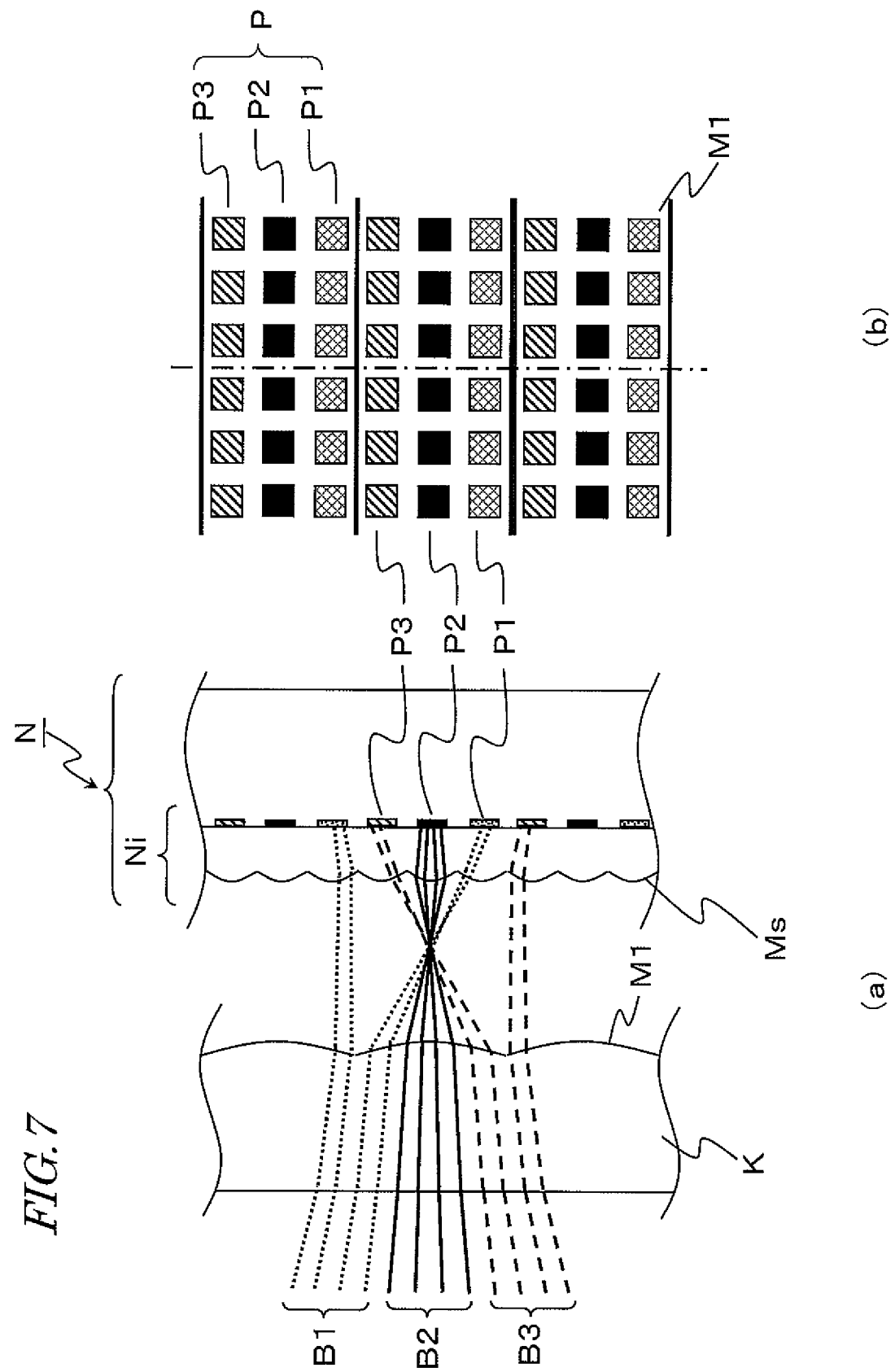
FIG. 7 (a) is an enlarged view of the arrayed optical device K and the imaging device N of Embodiment 2 shown in FIG. 5, and (b) is a diagram showing the positional relationship between the arrayed optical device K and pixels of the imaging device N.

FIG. 7($a$) is an enlarged view of the arrayed optical device K and the imaging device N shown in FIG. 5, and FIG. 7($b$) is a diagram showing the positional relationship between the arrayed optical device K and pixels on the imaging device N. The arrayed optical device K is arranged so that the surface on which the optical elements M1 are formed faces the imaging surface Ni. The pixels P are arranged in a matrix pattern on the imaging surface Ni. The pixels P can be grouped into pixels P1, pixels P2, and pixels P3.

The pixels P1, the pixels P2 and the pixels P3 are arranged in rows in the horizontal direction (row direction). In the vertical direction (column direction), the pixels P1, P2 and P3 are arranged alternating with one another. The arrayed optical device K is arranged so that each optical element M1 thereof corresponds to three rows of pixels including one row of pixels P1, one row of pixels P2 and one row of pixels P3 on the imaging surface Ni. Microlenses Ms are provided on the imaging surface Ni so as to cover the surface of the pixels P1, P2 and P3.

The arrayed optical device K is designed so that the majority of the light beam B1 (the light beam B1 represented by dotted lines in FIG. 5) having passed through the optical area D1 on the optical device L1 (shown in FIG. 5 and FIG. 6) arrives at the pixels P1 on the imaging surface Ni, the majority of the light beam (the light beam B2 represented by solid lines in FIG. 5) having passed through the optical area D2 arrives at the pixels P2 on the imaging surface Ni, and the majority of the light beam (the light beam B3 represented by broken lines in FIG. 5) having passed through the optical area D3 arrives at the pixels P3 on the imaging surface Ni. Specifically, the configuration described above is realized by appropriately setting parameters such as the refractive index of the arrayed optical device K, the distance from the imaging surface Ni, and the radius of curvature at the surface of the optical element M1.

With such a configuration, the pixels P1, the pixels P2 and the pixels P3 generate image information corresponding to light of different wavelength bands from each other. That is, the imaging apparatus A is capable of obtaining a plurality of image information formed by light of different wavelength bands from each other through a single imaging operation using a single imaging optical system.

While Embodiment 1 is a structure with which images of two different wavelength bands are obtained simultaneously, Embodiment 2 is capable of simultaneously obtaining images of three different wavelength bands.

Specific examples of the three different wavelength bands will be shown.

In one example, the first optical area D1 is a blue color filter that transmits therethrough light of the blue band while substantially blocking colors of non-blue bands. The second optical area D2 is a green color filter that transmits therethrough light of the green band while substantially blocking colors of non-green bands. The third optical area D3 is a red color filter that transmits therethrough light of the red band while substantially blocking colors of non-red bands. Thus, it is possible to realize an imaging apparatus capable of obtaining a full-color image using a monochrome imaging device. The filters are not limited to filters of primary colors as described above, but may be filers of complementary colors (cyan, magenta, yellow). By using a dielectric multi-layer film as the color filters described above, it is possible to obtain an image with a better color reproducibility than with organic filters.

In the present embodiment, the pixel value is missing for every third pixel in the y direction. The pixel value of the pixel for which it is missing may be generated by interpolation with pixel values of pixels adjacent thereto in the y direction, or pixel values in the x direction may be added together in groups of three pixels.

A configuration may be used where the aspect ratio between the x direction and the y direction of each pixel of the imaging device is 3:1. With such a configuration, the interpolation process or the addition process as described above will be unnecessary.

Embodiment 3

Embodiment 3 is different from Embodiment 1 in that the area of the optical device L1 of FIG. 1 is divided in four, and that the arrayed optical device is switched from a lenticular to a microlens. Herein, what is substantially the same as Embodiment 1 will not be described in detail.

Figure 8:
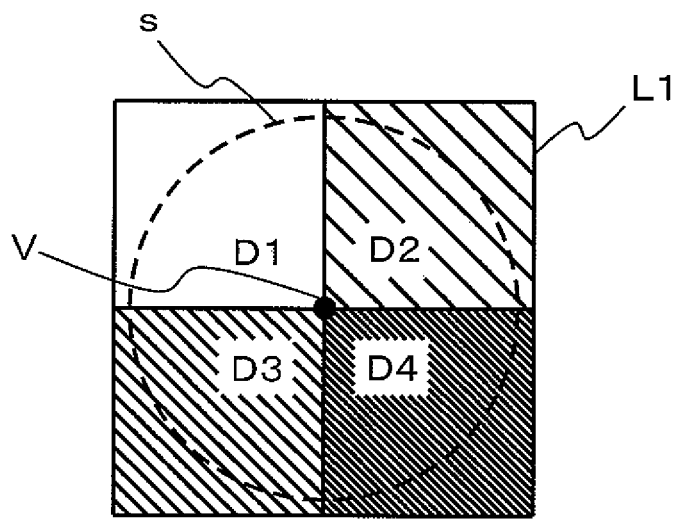
FIG. 8 A front view of the optical device L1 in Embodiment 3 of the present invention as seen from the object side.

FIG. 8 is a front view of the optical device L1 as seen from the object side, and the optical areas D1, D2, D3 and D4 are formed by four-fold division in the up-down direction and the left-right direction in a plane vertical to the optical axis V with the optical axis V being the center of the boundary. The wavelength bands of light passing through different optical areas are different from each other.

Figure 9:
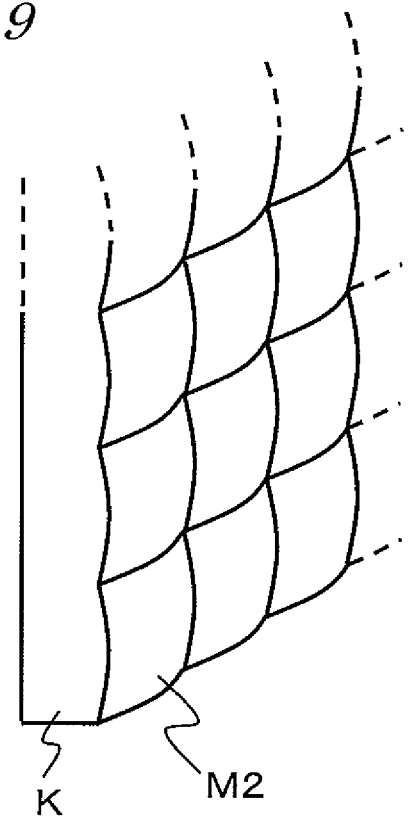
FIG. 9 A perspective view of the arrayed optical device K in Embodiment 3 of the present invention.

FIG. 9 is a perspective view of the arrayed optical device K. Optical elements M2 are arranged in a lattice pattern on one surface of the arrayed optical device K that is closer to the imaging device N. The cross sections (the cross section in the vertical direction and the cross section in the horizontal direction) of each optical element M2 has a curved shape, and each optical element M2 is protruding toward the imaging device N. Thus, the optical elements M2 are microlenses, and the arrayed optical device K is a microlens array.

Figure 10:
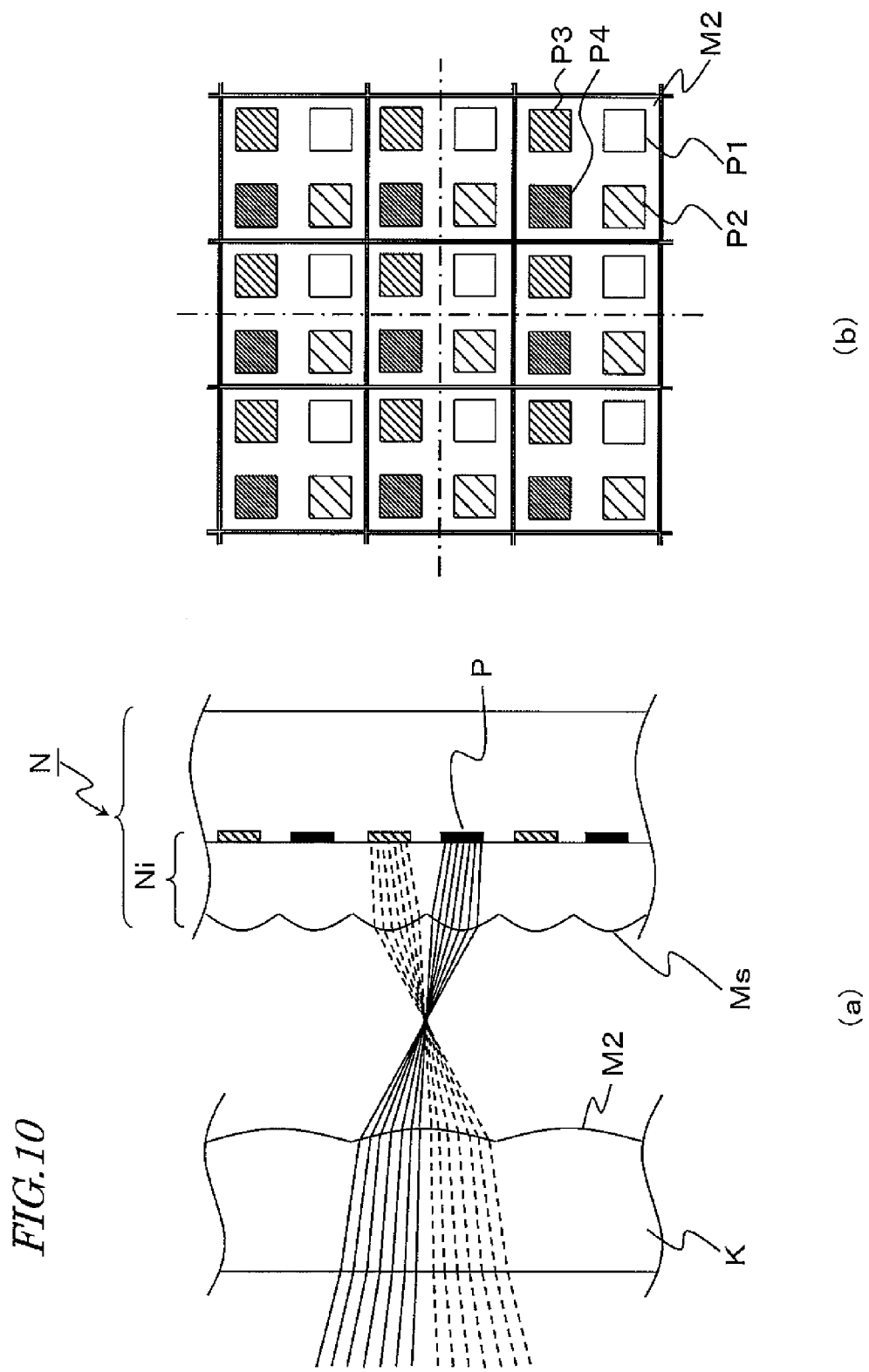
FIG. 10 (a) is an enlarged view of the arrayed optical device K and the imaging device N of Embodiment 3, and (b) is a diagram showing the positional relationship between the arrayed optical device K and pixels of the imaging device N.

FIG. 10(a) is an enlarged view of the arrayed optical device K and the imaging device N, and FIG. 10(b) is a diagram showing the positional relationship between the arrayed optical device K and pixels on the imaging device N. The arrayed optical device K is arranged so that the surface on which the optical elements M2 are formed faces the imaging surface Ni. The pixels P are arranged in a matrix pattern on the imaging surface Ni. The pixels P can be grouped into pixels P1, pixels P2, pixels P3 and pixels P4.

As in Embodiment 1, the arrayed optical device K is arranged in the vicinity of the focal point of the lens optical system L, and is arranged at a position at a predetermined distance from the imaging surface Ni. Microlenses Ms are provided on the imaging surface Ni so as to cover the surface of the pixels P1, P2, P3 and P4.

The arrayed optical device K is arranged so that the surface on which the optical elements M2 are formed faces the imaging surface Ni. The arrayed optical device K is arranged so that each optical element M2 thereof corresponds to two rows and two columns, i.e., four, of pixels P1-P4 on the imaging surface Ni.

The arrayed optical device K is designed so that the majority of the light beam having passed through the optical areas D1, D2, D3 and D4 on the optical device L1 arrive at the pixel P1, the pixel P2, the pixel P3 and the pixel P4, respectively, on the imaging surface Ni. Specifically, the configuration described above is realized by appropriately setting parameters such as the refractive index of the arrayed optical device K, the distance from the imaging surface Ni, and the radius of curvature at the surface of the optical element M1.

With such a configuration, the pixels P1, the pixels P2, the pixels P3 and the pixels P4 generate image information corresponding to light of different wavelength bands from each other. That is, the imaging apparatus A is capable of obtaining a plurality of image information formed by light of different wavelength bands through a single imaging operation using a single imaging optical system.

While Embodiment 1 and Embodiment 2 are structures with which images of two and three wavelength bands, respectively, are obtained simultaneously, Embodiment 3 is capable of simultaneously obtaining images of four different wavelength bands.

Specific examples of the four different wavelength bands will be shown.

In one example, in addition to the blue, green and red color filters described in Embodiment 2, the configuration further includes a near infrared light filter that substantially blocks visible light including blue, green and red and transmits therethrough near infrared light. Thus, it is possible to realize an imaging apparatus for day and night use or an imaging apparatus for biometric authentication. With such an imaging apparatus, when obtaining an image of near infrared light, it is preferred to provide a light source having spectral radiation characteristics including the band of near infrared light.

In another example, in addition to the blue, green and red color filters described in Embodiment 2, the configuration further includes a near ultraviolet light filter that substantially blocks visible light including blue, green and red and transmits therethrough near ultraviolet light. Thus, it is possible to realize an imaging apparatus for visualizing conditions of the skin such as blotches due to near ultraviolet rays. With such an imaging apparatus, when obtaining an image of near ultraviolet light, it is preferred to provide a light source having spectral radiation characteristics including the band of near ultraviolet light.

In another example, in addition to the blue, green and red color filters described in Embodiment 2, the configuration further includes a filter that transmits therethrough only a wavelength band of a narrower band width than the band widths of the spectral transmittance characteristics of the blue, green and red color filters. Thus, it is possible to realize an imaging apparatus for endoscope or capsule endoscope applications with which it is possible to observe lesions with a narrow band. The narrow band may or may not be included in the band of any of the blue, green and red color filters. With such an imaging apparatus, it is preferred to provide one type of a light source having spectral radiation characteristics including blue, green and red and the narrow band, or a plurality of types of light sources having spectral radiation characteristics corresponding respectively to the bands of blue, green and red and the narrow band. The light source may include a white light source and a light source having spectral radiation characteristics including the narrow band.

In the present embodiment, the pixel value is missing for every other pixel in the x direction and in the y direction. Therefore, the pixel value of the pixel for which it is missing may be generated by interpolation with pixel values of pixels adjacent thereto in the x direction and in the y direction.

Two of the four areas obtained by four-fold division that oppose each other with the optical axis interposed therebetween may be color filters of the same green color. With such a configuration, the number of green pixels increases, and it is therefore possible to improve the resolution of the green image component.

Embodiment 4

Embodiment 4 is different from Embodiment 1 in that the first optical area D1 and the second optical area D2 are each arranged in two separate parts with the optical axis interposed therebetween, and that the arrayed optical device is switched from a lenticular to a microlens. Herein, what is substantially the same as Embodiment 1 will not be described in detail.

Figure 11:
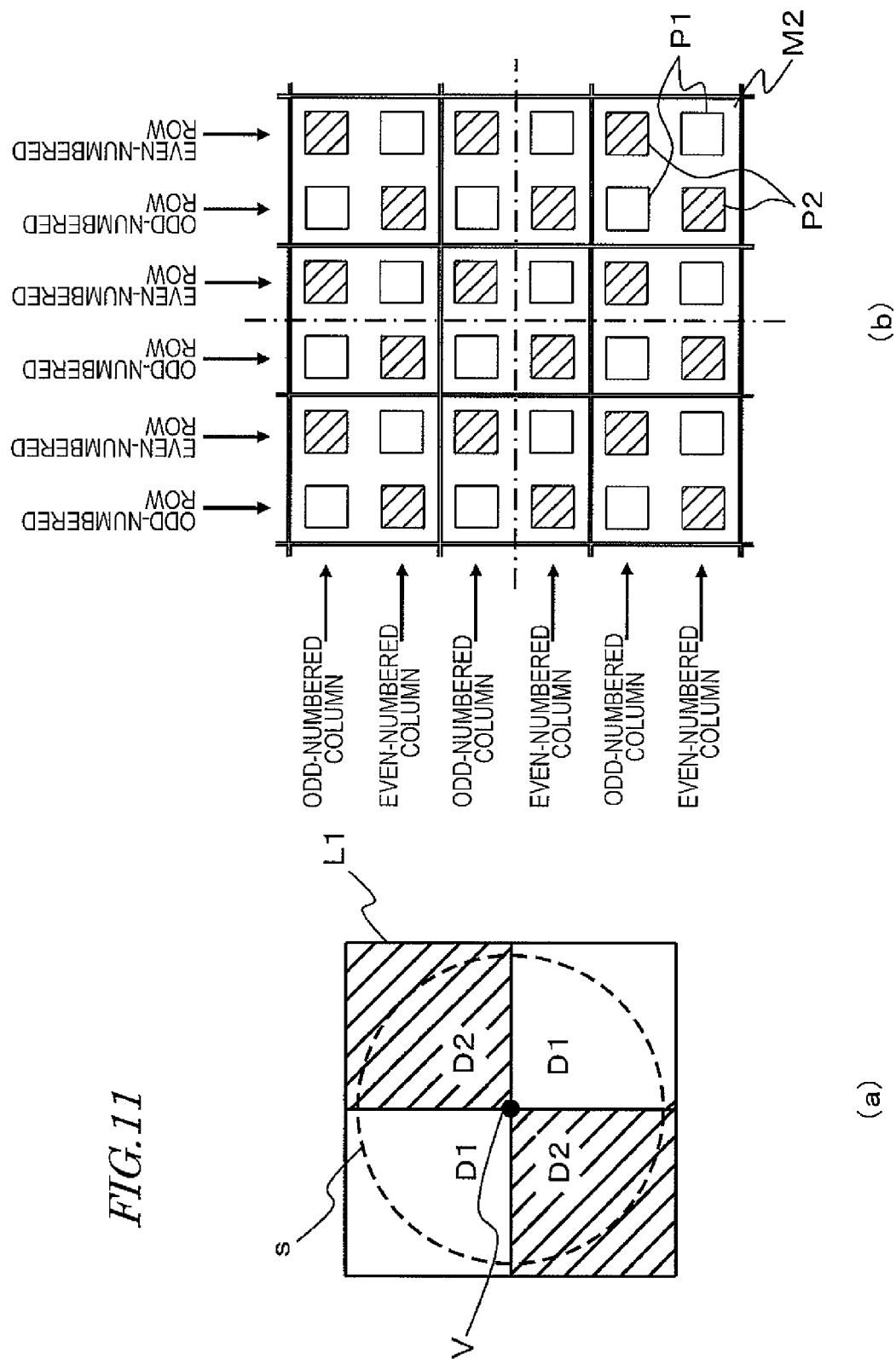
FIG. 11 (a) A front view of the optical device L1 in Embodiment 4 of the present invention as seen from the object side, and (b) is a diagram showing the positional relationship between the arrayed optical device K and pixels of the imaging device N.

FIG. 11(a) is a front view of the optical device L1 as seen from the object side, and the optical areas D1 and D2 are each arranged in two separate parts opposing each other in an axial symmetry direction with the optical axis V being the center so that the centroid thereof is the optical axis position. FIG. 11(b) is a diagram showing the positional relationship between the arrayed optical device N and pixels on the imaging device N. In Embodiment 4, light beams having passed through the optical area D1 arrive at odd-numbered row/odd-numbered column positions and at even-numbered row/even-numbered column positions, and therefore the odd-numbered row/odd-numbered column positions and the even-numbered row/even-numbered column positions are added together to generate an image corresponding to the first wavelength band. Light beams having passed through the optical area D2 arrive at even-numbered row/odd-numbered column positions and odd-numbered row/even-numbered column positions, and therefore the even-numbered row/odd-numbered column positions and the odd-numbered row/even-numbered column positions are added together to generate an image corresponding to the second wavelength band.

In Embodiment 1, the first optical area D1 and the second optical area D2 are areas obtained by two-fold division of the optical device L1 in the up-down direction in a plane vertical to the optical axis. Therefore, the spot centroids on the image plane of light having passed through different optical areas may vary depending on the object distance, thereby causing parallax.

Figure 12:
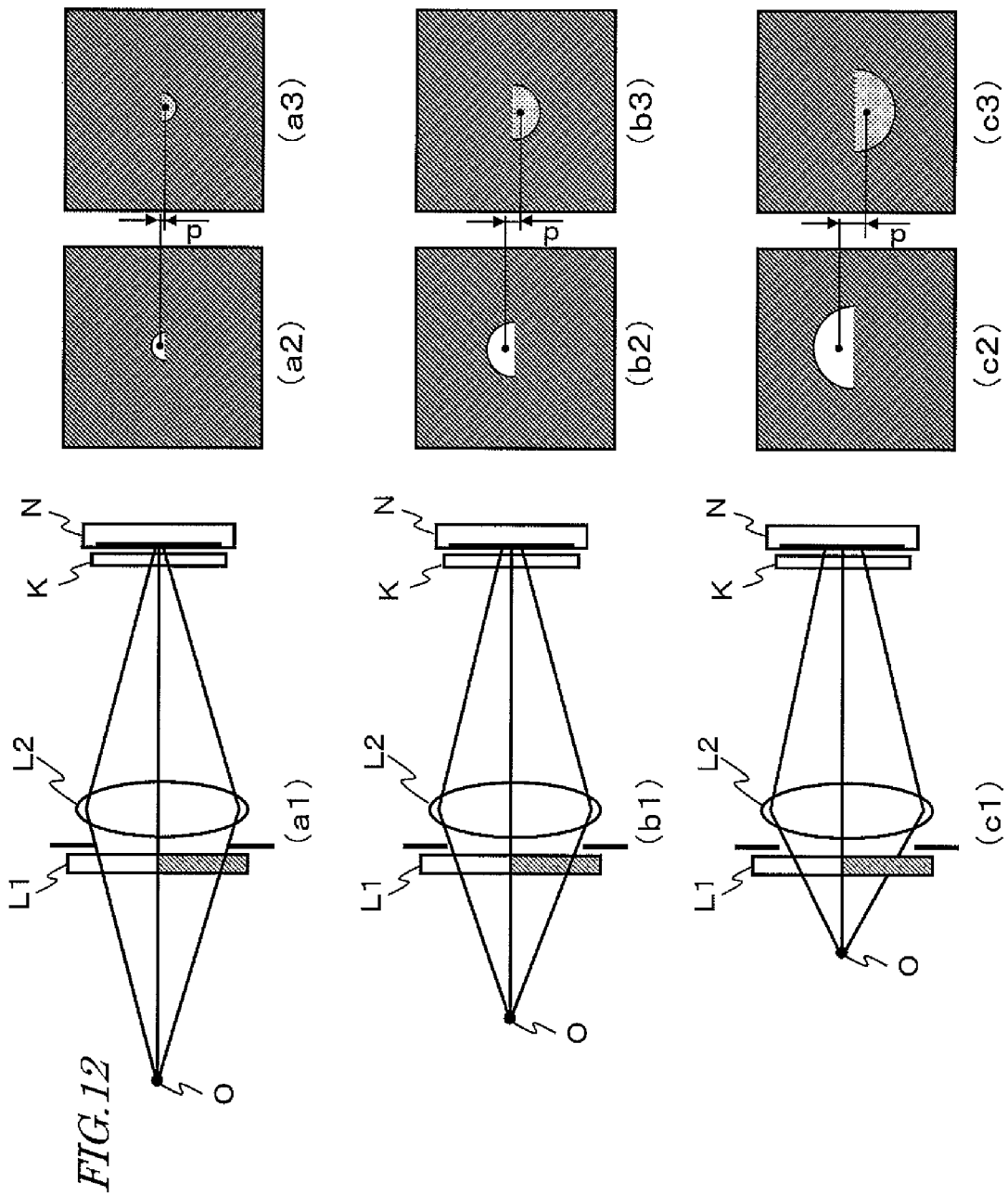
FIG. 12 Ray diagrams for different object distances in Embodiment 1 of the present invention, and diagrams illustrating point images and changes in centroids thereof.

FIG. 12 shows ray diagrams for different object distances in Embodiment 1, and diagrams illustrating point images and changes in centroids thereof. FIGS. 12(a1), (b1) and (c1) show ray diagrams for different object distances. FIG. 12(a1) is a ray diagram for a case where the object point O is at the greatest distance from the optical system, FIG. 12(c1) is for a case where the object point O is at the least distance, and FIG. 12(b1) is for a case where the object point O is at a distance between that of (a1) and that of (c1). The same elements as those of FIG. 1 are denoted by the same reference signs. FIGS. 12(a2) and (a3), (b2) and (b3), and (c2) and (c3) show the point images (shown as semicircles) that are imaged through lenticulars and the centroids thereof (shown as black dots), corresponding to the object distances of (a1), (b1) and (c1) of FIG. 12, respectively.

The point images are shown schematically as images obtained by interpolating the image information (a2, b2, c2) extracted for each odd-numbered column and the pixel information (a3, b3, c3) extracted for each even-numbered column for pixel values that are missing for every other pixel in the y direction. As the obtained image is divided into the odd-numbered column image and the even-numbered column image as shown in the figure, the point images of the images are two semicircular shapes obtained by dividing a single circle in two. The spot diameter increases as the object point O comes closer. Therefore, the inter-centroid distance d between the point images of the images increases as the object comes closer. The inter-centroid distance d is not desirable because it results in a parallax.

On the other hand, in Embodiment 4, the optical areas D1 and D2 are arranged to be separated from each other in an axial symmetry direction about the optical axis so that the centroid thereof is the optical axis position. Thus, the centroids of point images formed by light having passed through the optical areas D1 and D2 are also present at the optical axis position. Therefore, the inter-centroid distance d between point images does not vary even when the object distance varies.

FIG. 13 shows diagrams illustrating point images and centroids thereof for different object distances. In FIGS. 13, (a1) and (a2), (b1) and (b2), and (c1) and (c2) show the point images (shown in semicircles) that are imaged through lenticulars and the centroids thereof (black dots), corresponding to the object distances of (a1), (b1) and (c1) of FIG. 12, respectively.

The point images schematically show image information (a1, b1, c1) obtained by adding together the odd-numbered row/odd-numbered column positions and the even-numbered row/even-numbered column positions, and image information (a2, b2, c2) obtained by adding together the even-numbered row/odd-numbered column positions and the odd-numbered row/even-numbered column positions. As shown in the figure, in Embodiment 4, when the obtained image is divided into an image obtained by adding together the odd-numbered row/odd-numbered column positions and the even-numbered row/even-numbered column positions and an image obtained by adding together the even-numbered row/odd-numbered column positions and the odd-numbered row/even-numbered column positions, the point images of the images are fan shapes opposing each other in an axial symmetry direction about the optical axis. Since the centroids of these point image coincide with each other, the inter-centroid distance d between the point images of the images does not vary even when the object distance varies.

Thus, in Embodiment 4, as the optical areas D1 and D2 are each arranged in separate parts opposing each other in an axial symmetry direction about the optical axis so that the centroid thereof is the optical axis position, it is possible to ensure that a parallax does not occur between obtained images even when the object distance varies.

Embodiment 5

Embodiment 5 is a configuration having two optical areas D1 and D2 as in Embodiment 1, and further assumes that the lens L2 is a lens with axial chromatic aberration. With such a configuration, two areas with different levels of optical power are provided in a plane vertical to the optical axis in the vicinity of the stop so that the focus positions of light beams having passed through the optical areas D1 and D2 are substantially equal to each other. The embodiment is different from Embodiment 1 in this regard. Herein, what is substantially the same as Embodiment 1 will not be described in detail.

In the present embodiment, one of the two areas with different levels of optical power transmits therethrough light that passes through the first optical area D1. The other area transmits therethrough light that passes through the second optical area D2. The optical areas D1 and D2 and the two areas with different levels of optical power may be formed on the same device or formed on different devices.

An imaging apparatus of the present embodiment will now be described in detail.

Figure 14:
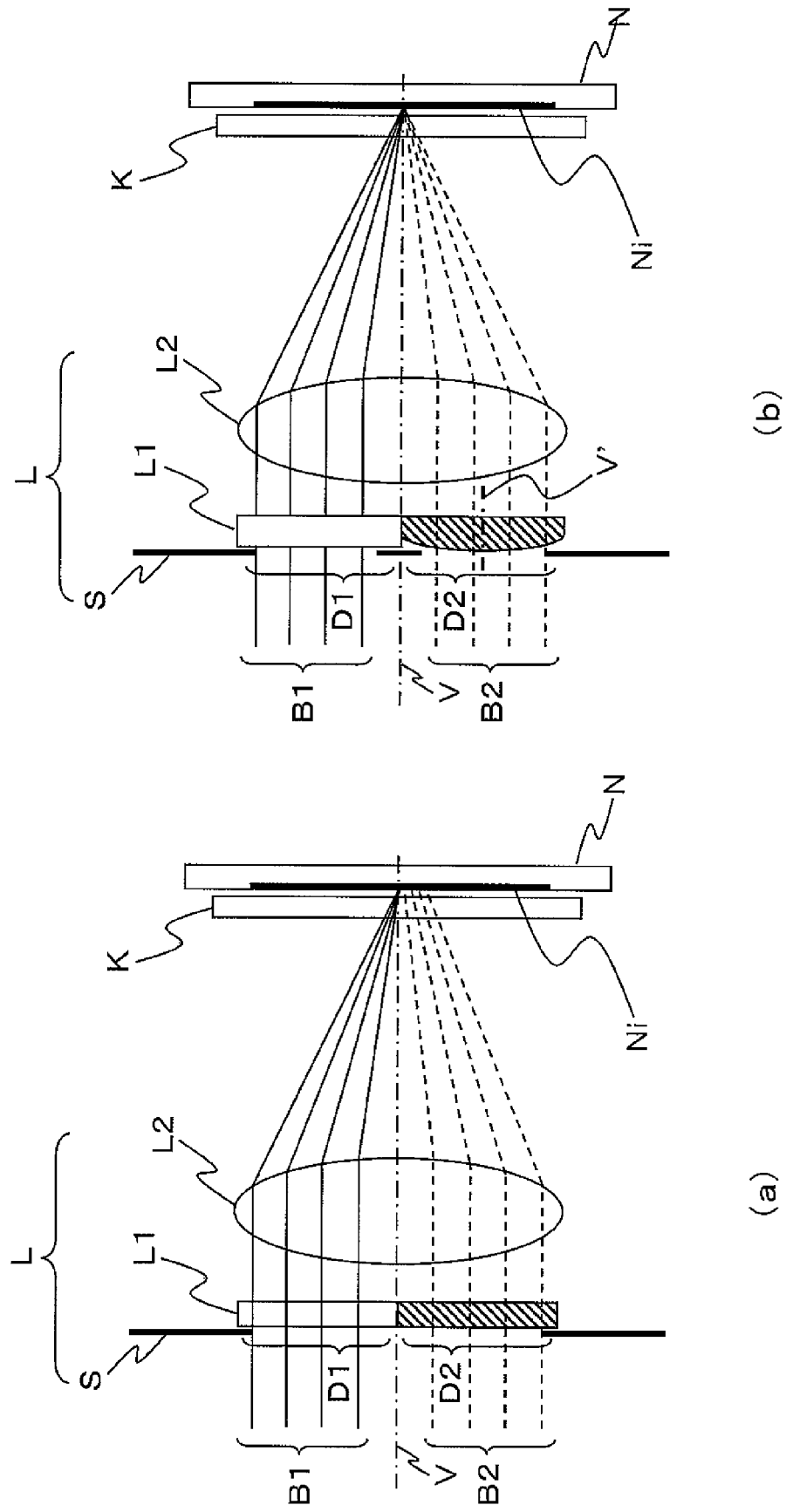
FIGS. 14 (a) and (b) are schematic diagrams showing an optical system and an imaging section in Embodiment 5 of the present invention.

FIG. 14(a) is a diagram schematically showing a ray diagram in Embodiment 1 in a case where the lens L2 is a lens that has axial chromatic aberration due to the wavelength dispersion characteristics of the refractive index as does a single lens. In FIG. 14(a), a filter that transmits therethrough light of the first wavelength band is formed in the first optical area D1, and a filter that transmits therethrough light of the second wavelength band, relatively longer than the first wavelength band, is formed in the second optical area D2. Since the lens L2 is a lens that has axial chromatic aberration due to the wavelength dispersion characteristics of the refractive index, as does a single lens, for example, light having a longer wavelength is focused farther away from the lens. Therefore, if the settings are such that light beams having passed through the optical area D1 are focused on the imaging surface Ni as shown in FIG. 14(a), light beams having passed through the optical area D2 will not yet be focused on the imaging surface Ni.

FIG. 14(b) is a diagram schematically showing a ray diagram for an imaging apparatus of Embodiment 5. In FIG. 14(b), as compared with the configuration of FIG. 14(a), a lens surface with such optical power that light beams of the wavelength band of second spectral transmittance characteristics will focus on the imaging surface is formed in the second optical area D2 of the optical device L1. Therefore, light beams having passed through the first optical area D1 and light beams having passed through the second optical area D2 are both focused on the imaging surface Ni. Thus, according to the present embodiment, as the first optical area D1 and the second optical area D2 have different levels of optical power, the focus position of light passing through the first optical area D1 and the focus position of light passing through the second optical area D2 are brought closer to each other, as compared with a case where the first optical area D1 and the second optical area D2 have an equal level of optical power. In FIG. 14(b), the optical axis V' of the optical on one side of the optical area D2 of the optical device L1 that is closer to the stop S has eccentricity as opposed to the optical axis V of the lens optical system, but since the optical power is very small as compared with the optical power of the lens L2, there is little deterioration of imaging performance.

Figure 15:
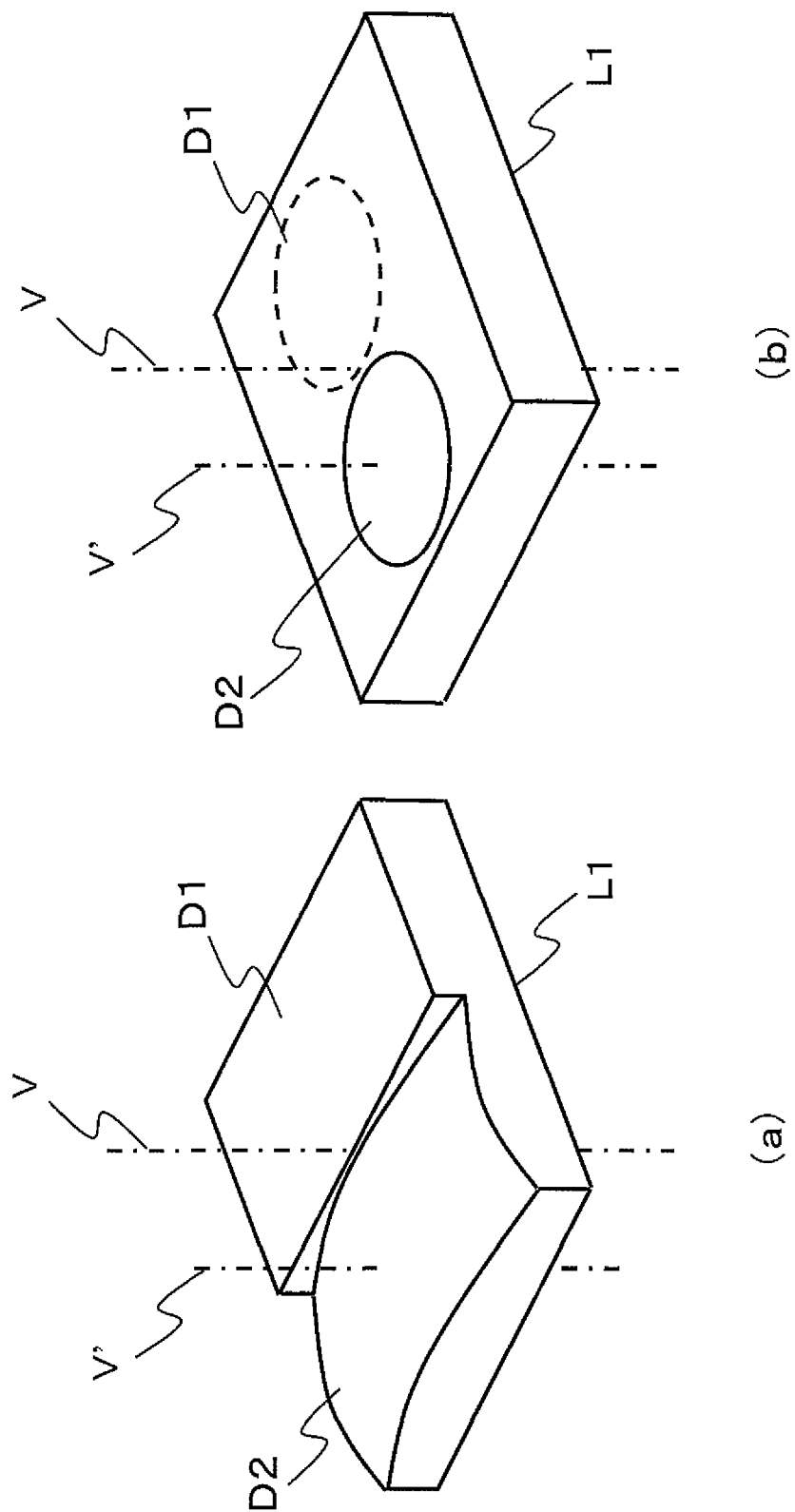
FIGS. 15 (a) and (b) are perspective views showing the optical device L1 in Embodiment 5 of the present invention.
Figure 16:
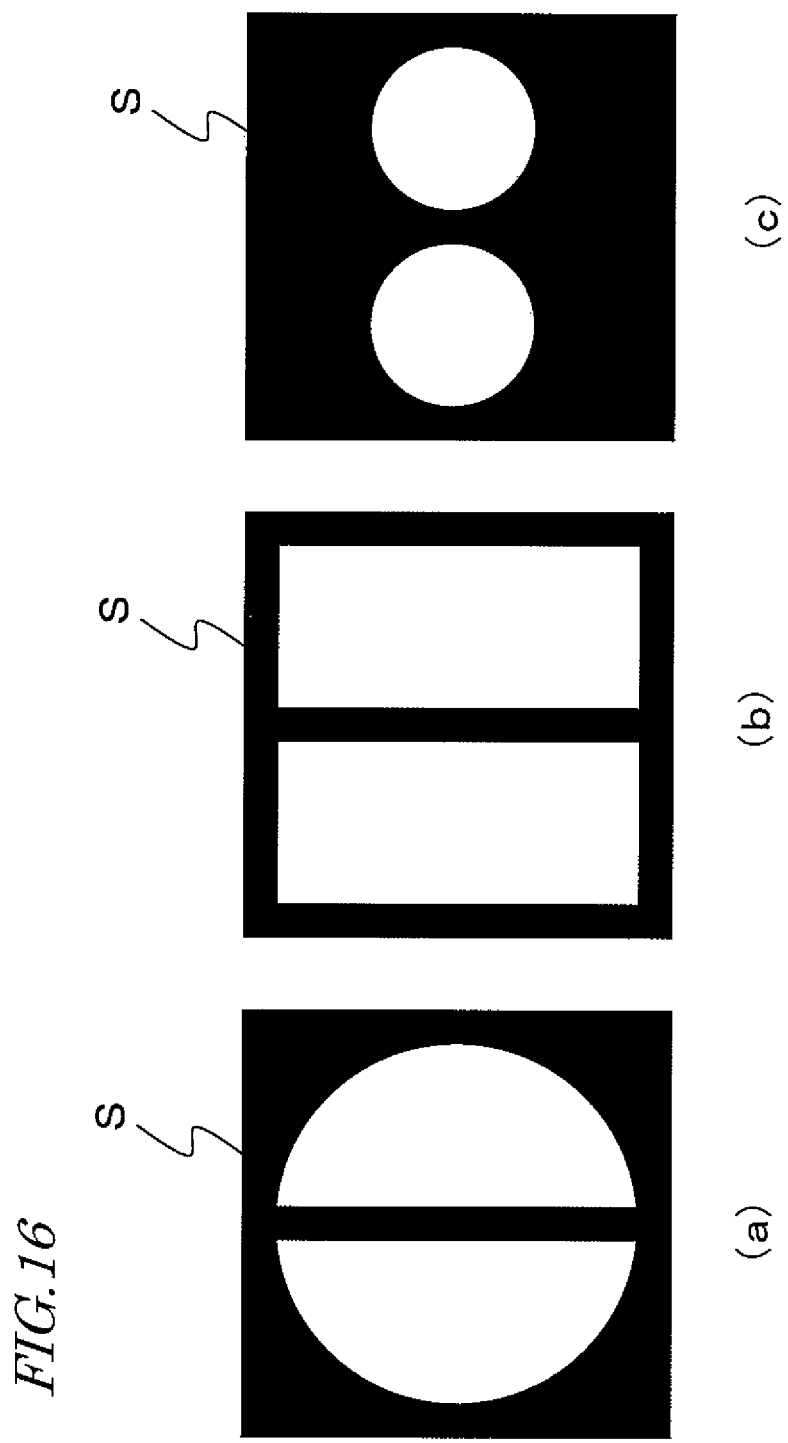
FIGS. 16 (a), (b) and (c) are front views of a stop S in Embodiment 5 of the present invention as seen from the object side.

FIGS. 15(a) and (b) are perspective views of the optical device L1 shown in FIG. 14(b). In either configuration, a filter having first spectral transmittance characteristics is formed on the first optical area D1, and a filter having second spectral transmittance characteristics is formed on the second optical area D2, which is the lens surface. In the configuration of FIG. 15(a), the lens surface is formed across the entire areas obtained by dividing the optical device L1 in two. Therefore, there is a step between the first optical area, which is a plane, and the second optical area D2, which is a lens surface. Since light beams having passed through such a step become unnecessary light, the stop S preferably has a configuration in which a light-blocking area is provided as shown in FIGS. 16(a) and (b). With the configuration of FIG. 15(b), a lens surface is formed in a portion of an area obtained by dividing the optical device L1 in two, to obtain the optical area D2. This configuration requires a configuration where a light-blocking area is provided as shown in FIG. 16(c) so as to correspond to the optical areas D1 and D2.

Figure 17:
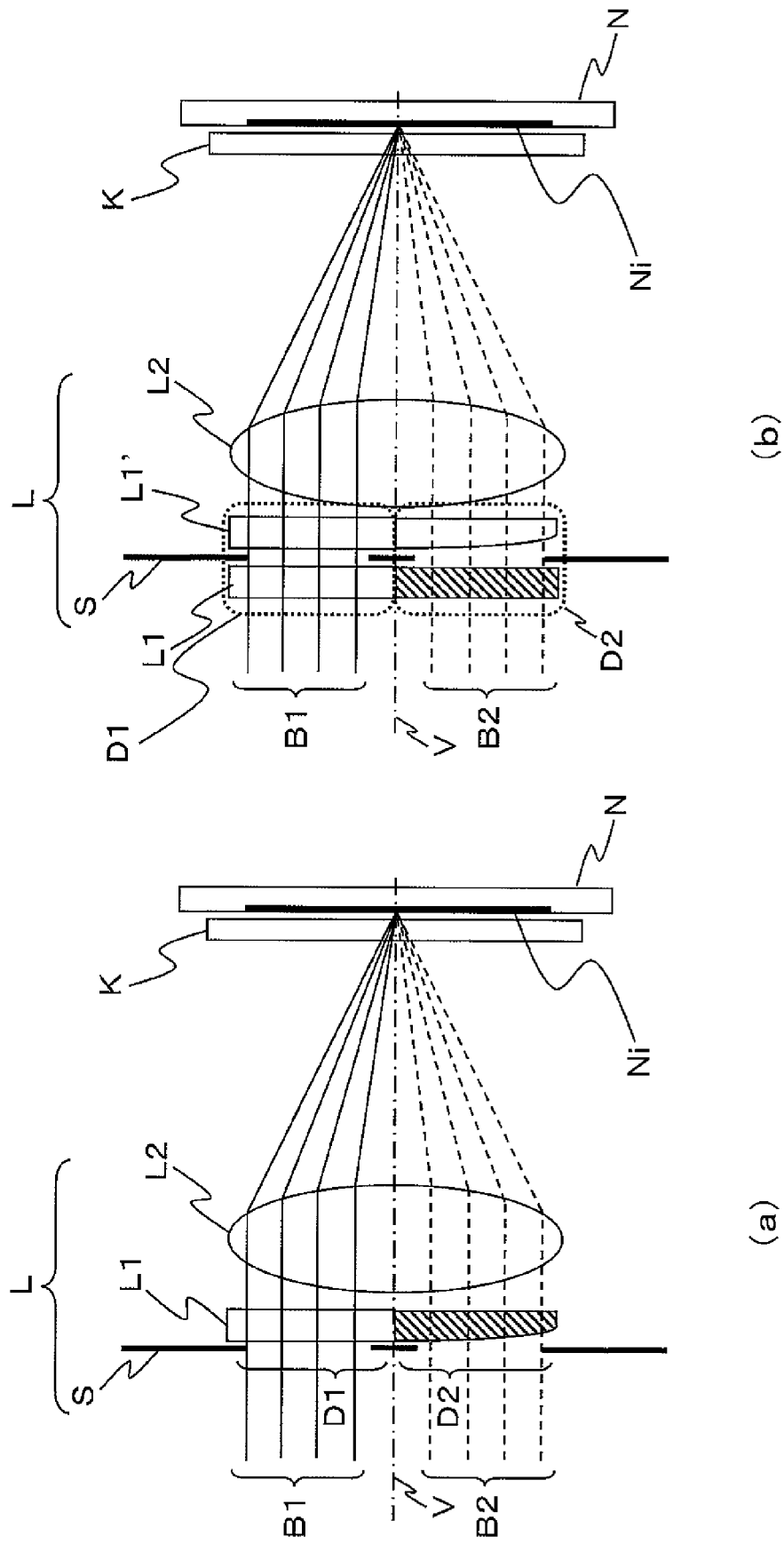
FIGS. 17 (a) and (b) are schematic diagrams showing an optical system and an imaging section in Embodiment 5 of the present invention.
Figure 18:
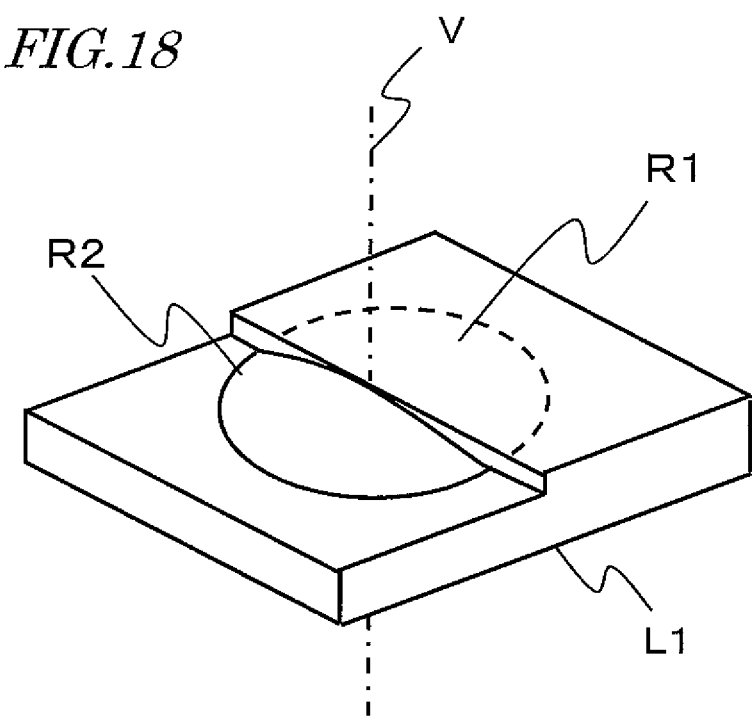
FIG. 18 A perspective view of the optical device L1 in Embodiment 5 of the present invention.

FIGS. 17(a) and (b) are diagrams showing other embodiments of Embodiment 5. While the optical axis V' of the surface on one side of the optical area D2 of the optical device L1 that is closer to the stop S is different from the optical axis V of the lens optical system in FIG. 14(b), the optical axis of the surface on one side of the optical area D2 of the optical device L1 that is closer to the stop S is the same as the optical axis of the lens L2 in FIG. 17(a). FIG. 18 is a perspective view of the optical device L1 shown in FIG. 17(a). With such a configuration, the eccentricity of the optical axis of the lens surface of the optical area D2 of the optical device L1 is eliminated, and it is possible to eliminate the deterioration of imaging performance due to eccentricity.

FIG. 17(b) is an example in which a separate lens is provided on the optical device L1, as opposed to FIG. 17(a). In FIG. 17(b), the optical device L1 on which filters of different spectral transmittance characteristics are formed is arranged on the object side in the vicinity of the stop, and an optical device L1' is arranged on the object side in the vicinity of the stop. Each of the optical devices L1 and L1' has the first optical area D1 and the second optical area D2. The second optical area D2 of the optical device L1' has a lens surface. As described above, the element forming a filter and the element forming a lens may be separate from each other. The positions of L1 and L1' may be switched around with respect to the stop.

Thus, in Embodiment 5, even when the lens L2 is a lens, such as a single lens, whose axial chromatic aberration is not corrected, the axial chromatic aberration can be reduced by providing two areas having different levels of optical power from each other in a plane vertical to the optical axis.

Embodiment 6

Embodiment 6 is a configuration having three optical areas D1, D2 and D3 as in Embodiment 2, and further assumes that the lens L2 is a lens with axial chromatic aberration. With such a configuration, three areas with different levels of optical power are provided in a plane vertical to the optical axis in the vicinity of the stop so that the focus positions of light beams having passed through the optical areas D1 and D2 are substantially equal to each other. The embodiment is different from Embodiment 5 in this regard. Herein, what is substantially the same as Embodiment 5 will not be described in detail.

Figure 19:
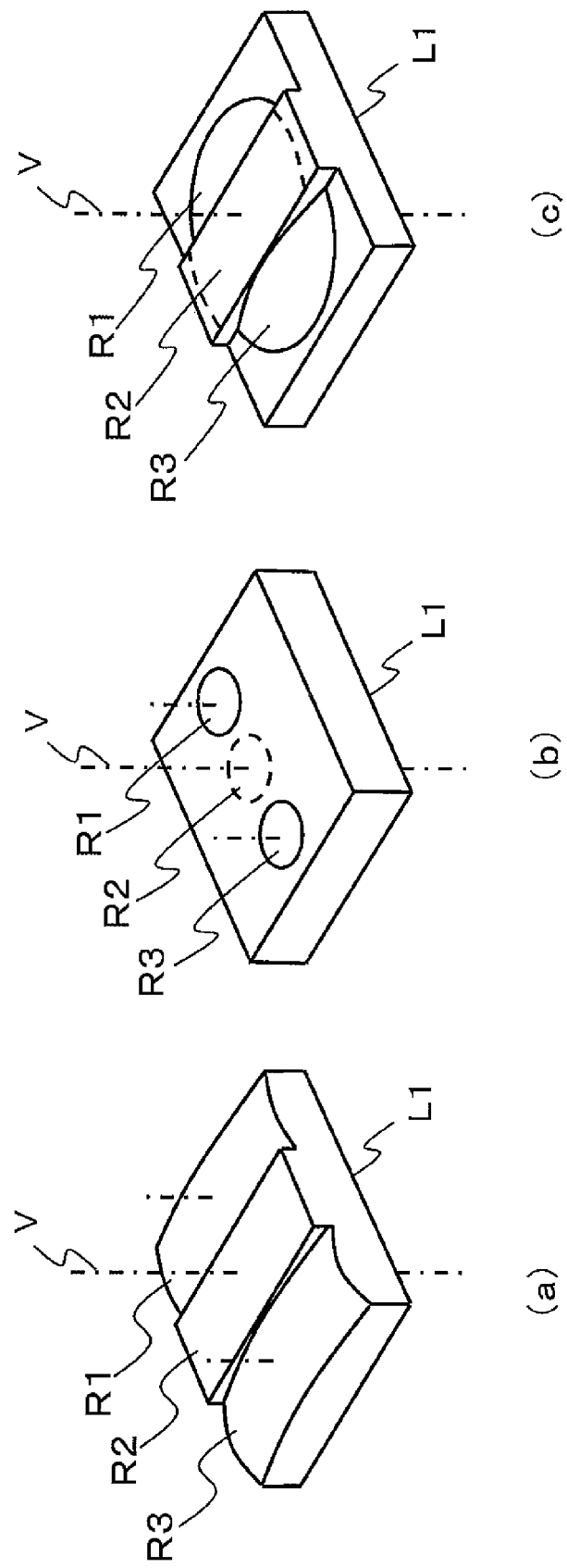
FIGS. 19 (a), (b) and (c) are perspective views of the optical device L1 in Embodiment 6 of the present invention.

FIGS. 19(a), (b) and (c) are perspective views showing the optical device L1 of Embodiment 6 where the optical area is divided in three.

Figure 20:
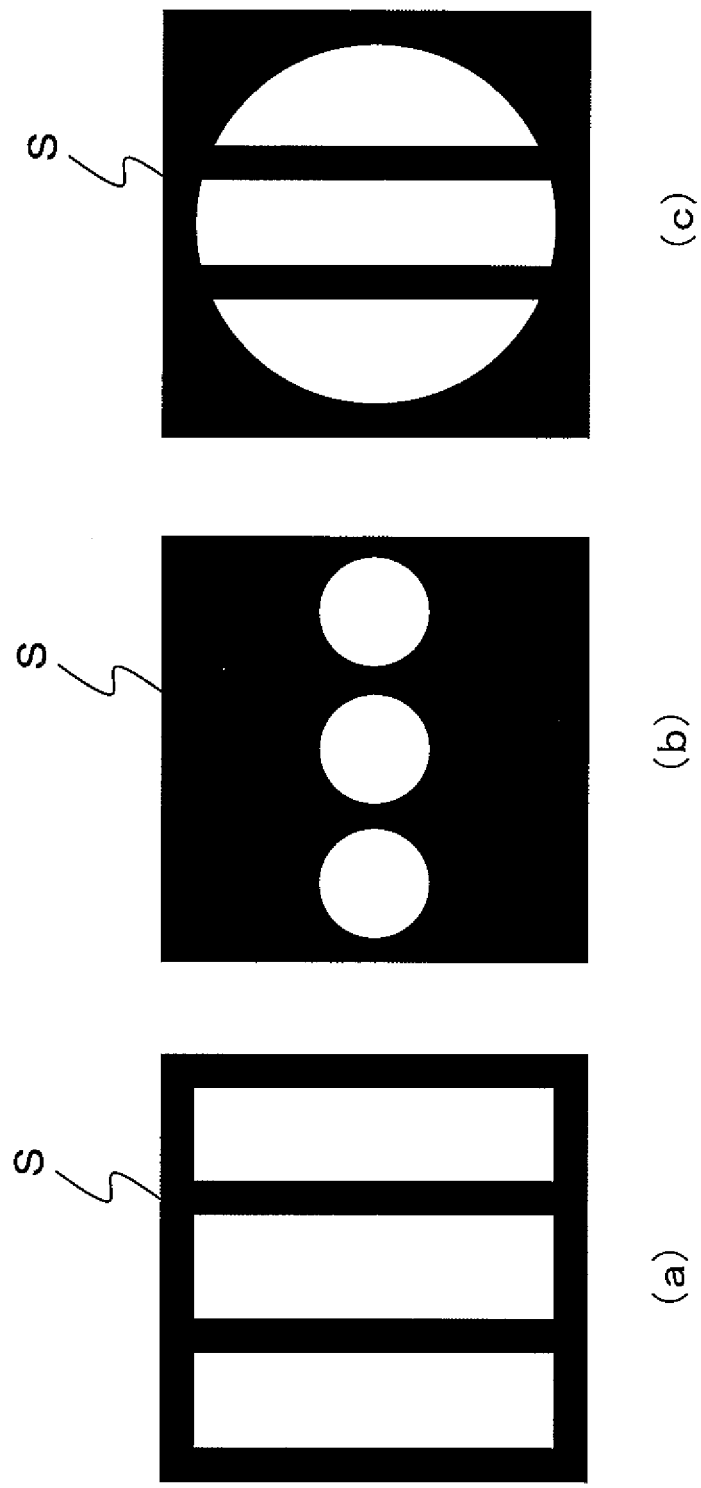
FIGS. 20 (a), (b) and (c) are front views of the stop S in Embodiment 6 of the present invention as seen from the object side.

The stop S has configurations shown in FIGS. 20(a), (b) and (c), similar to Embodiment 5.

Thus, in Embodiment 6, even if a lens, such as a single lens, whose axial chromatic aberration is not corrected is used, it is possible to reduce the axial chromatic aberration by providing three areas having different levels of optical power in a plane vertical to the optical axis.

Embodiment 7

Embodiment 7 is a configuration having four optical areas D1, D2, D3 and D4 as in Embodiment 3, and further assumes that the lens L2 is a lens with axial chromatic aberration. With such a configuration, four areas with different levels of optical power are provided in a plane vertical to the optical axis in the vicinity of the stop so that the focus positions of light beams having passed through the optical areas D1 and D2 are substantially equal to each other. The embodiment is different from Embodiment 5 in this regard. Herein, what is substantially the same as Embodiment 5 will not be described in detail.

Figure 21:
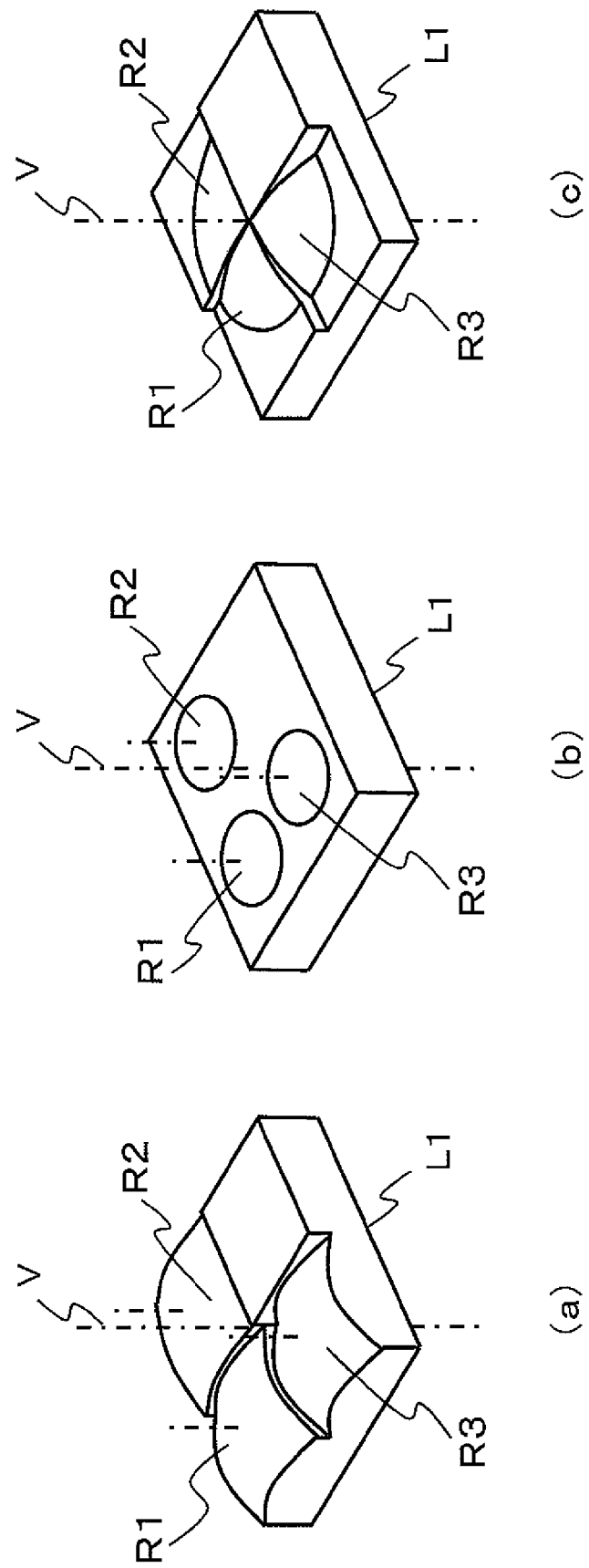
FIGS. 21 (a), (b) and (c) are perspective views of the optical device L1 in Embodiment 7 of the present invention.

FIGS. 21(a), (b) and (c) are perspective views showing the optical device L1 of Embodiment 7 where the optical area is divided in four.

Figure 22:
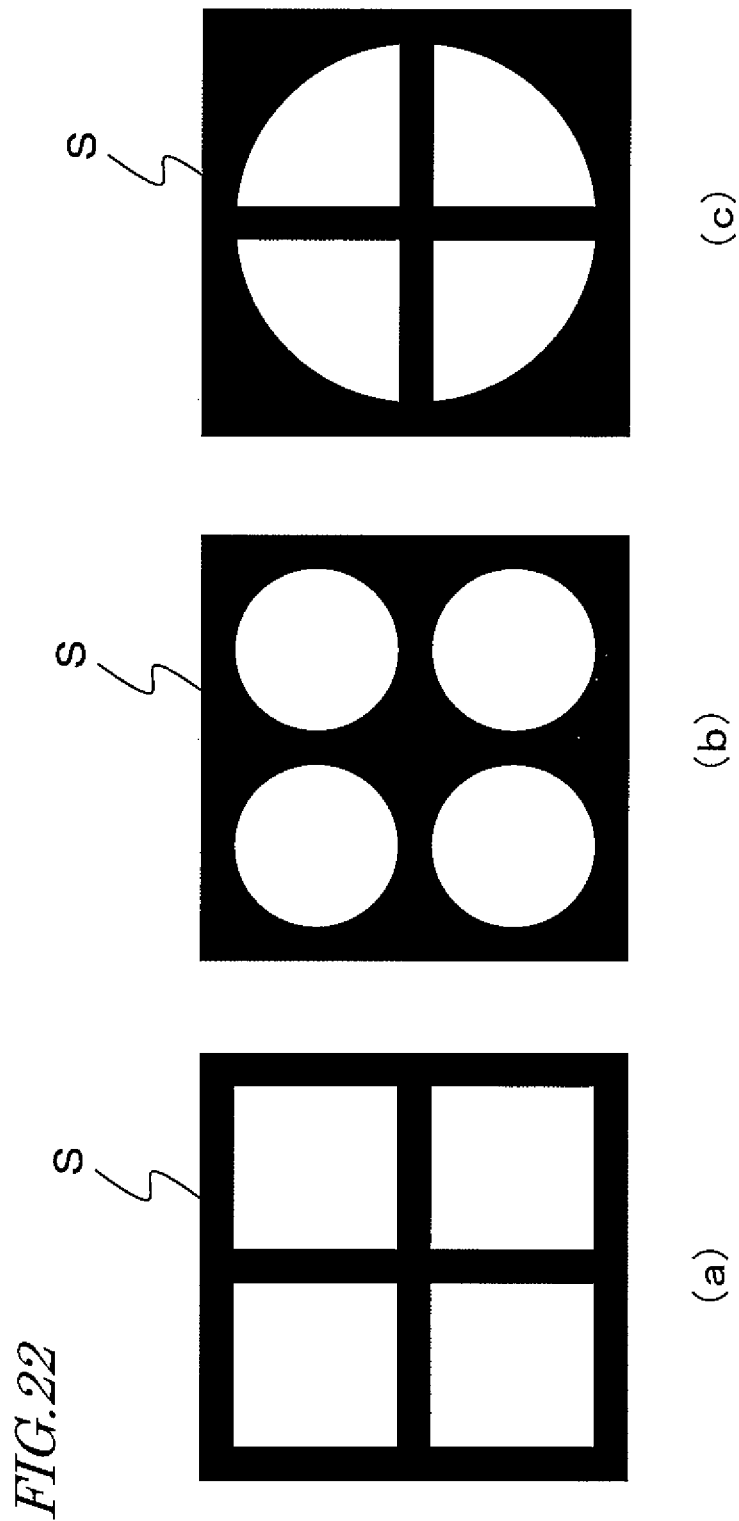
FIGS. 22 (a), (b) and (c) are front views of the stop S in Embodiment 7 of the present invention as seen from the object side.

The stop S has configurations shown in FIG. 22(a), (b) and (c), similar to Embodiment 5.

Thus, in Embodiment 7, even if a lens, such as a single lens, whose axial chromatic aberration is not corrected is used, it is possible to reduce the axial chromatic aberration by providing four areas having different levels of optical power in a plane vertical to the optical axis.

Embodiment 8

Embodiment 8 is different from Embodiments 1-7 in that a lenticular lens or a microlens array is formed on the imaging surface. Herein, what is substantially the same as Embodiments 1-7 will not be described in detail.

Figure 23:
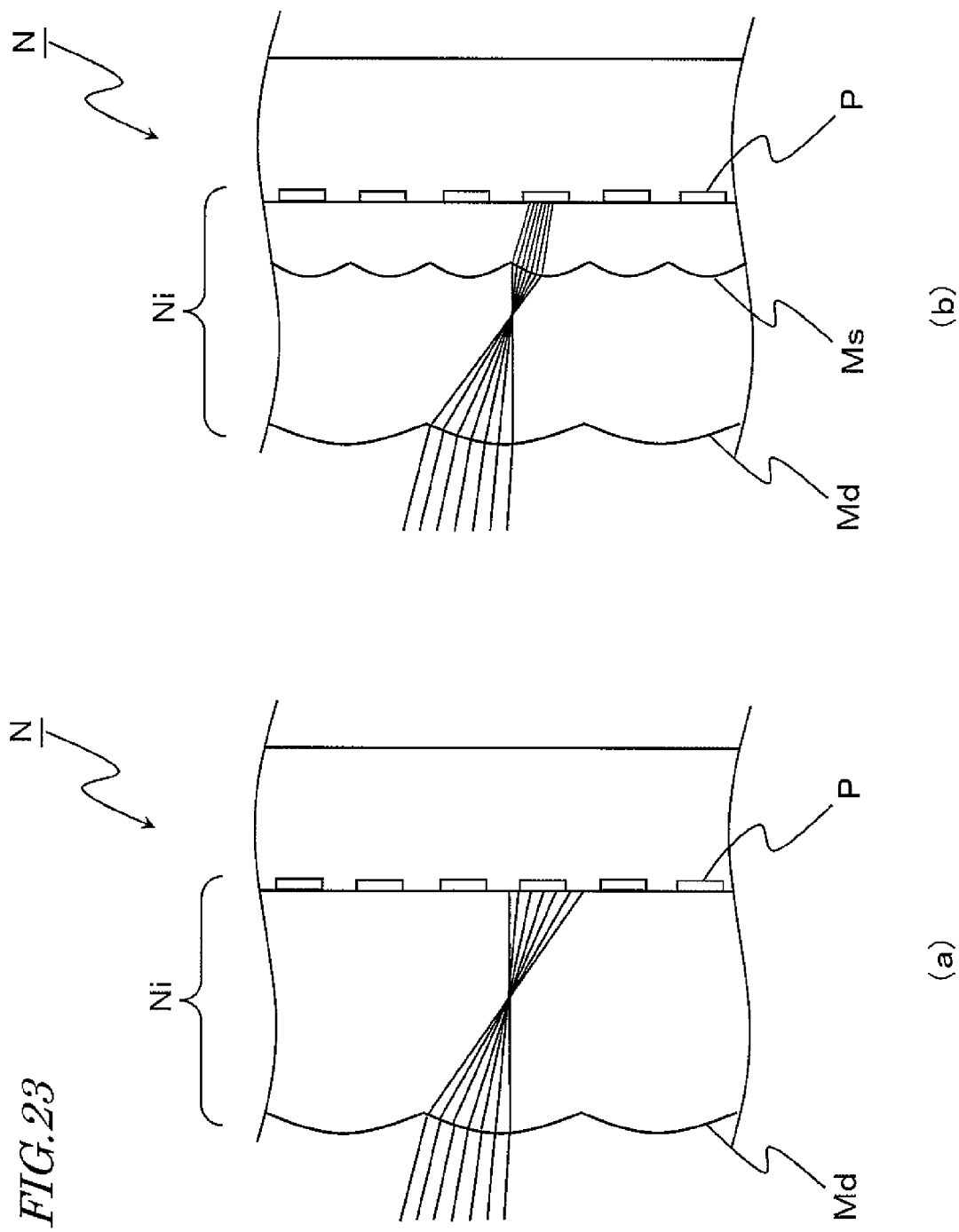
FIGS. 23 (a) and (b) are enlarged views of the arrayed optical device K and the imaging device N in Embodiment 8 of the present invention.

FIGS. 23(a) and (b) are enlarged views of the arrayed optical device K and the imaging device N. In the present embodiment, a lenticular lens (or a microlens array) Md is formed on the imaging surface Ni of the imaging device N. The pixels P are arranged in a matrix pattern, as in Embodiment 1, etc., on the imaging surface Ni. A single lenticular lens optical element or a single microlens corresponds to a plurality of pixels P. Also in the present embodiment, as in Embodiments 1-7, light beams having passed through different areas of the optical device L1 can be guided to different pixels. FIG. 23(b) is a diagram showing a variation of the present embodiment. In the configuration shown in FIG. 23(b), the microlenses Ms are formed on the imaging surface Ni so as to cover the pixels P, and the arrayed optical device is layered on the surface of the microlenses Ms. With the configuration shown in FIG. 23(b), it is possible to increase the light-condensing efficiency as compared with that of the configuration of FIG. 23(a).

When the arrayed optical device is separate from the imaging device as in Embodiments 1-7, the alignment between the arrayed optical device and the imaging device is difficult. However, with a configuration where the arrayed optical device K is formed on the imaging device as in Embodiment 8, the alignment can be done in the wafer process, thereby making the alignment easier and improving the alignment precision.

Other Embodiments

While Embodiments 1-8 are directed to configurations where the optical area is divided in two, three, or four, the number of division may be more.

While the lens L2 is a single lens, it may be a plurality of groups of lenses or a plurality of lenses.

While the optical area is arranged on one surface of the optical device L1 that is closer to the object, the optical area may be arranged on one surface of the optical device L1 that is closer to the image. In this case, it is preferred that the optical device L1 is arranged on the object side with respect to the position of the stop as it is then closer to the stop.

While the optical device L1 is arranged on the image side with respect to the position of the stop, it may be arranged on the object side with respect to the position of the stop. In this case, it is preferred that the optical area is arranged on the image side of the optical device L1 as it is then closer to the stop.

While the lens surface provided on the element, which is different from the optical device L1 or the optical device L1, is arranged on the object-side surface of the element in Embodiments 4, 5 and 6, it may be arranged on the image-side surface of the element.

While color filters arranged in different areas are arranged so that there is only one in the optical axis direction in Embodiments 1-8, a plurality of color filters may be layered on one another. For example, a dielectric multi-layer film filter and an absorption-type filter having different spectral transmittance characteristics may be layered together, or a dielectric multi-layer film may be formed on the absorption-type filter.

In Embodiments 1-8, an image-side non-telecentric optical system may be used, or an image-side telecentric optical system may be used. Many of the lenses used in imaging devices such as cameras use a non-telecentric optical system on the image side. Where an image-side non-telecentric optical system is used for the lens optical system L of an embodiment of the present invention, the primary light beam is incident slantly on the arrayed optical device K if the angle of view changes. FIG. 24(a) is an enlarged view showing the vicinity the imaging section outside the optical axis. FIG. 24(a) shows only the light beams, of all the light passing through the arrayed optical device K, that pass through one optical area. As shown in FIG. 24(a), where the lens optical system L is an image-side non-telecentric optical system, light is likely to leak to adjacent pixels, thereby causing crosstalk. However, by offsetting the arrayed optical device by Δ with respect to the pixel arrangement as shown in FIG. 24(b), it is possible to reduce the crosstalk and to suppress deterioration in color purity. Since the angle of incidence varies depending on the image height, the amount of offset Δ may be set in accordance with the angle of incidence of the light beam on the imaging surface.

An image-side telecentric optical system may be used for the lens optical system L of an embodiment of the present invention. With an image-side telecentric optical system, the primary light beam is incident on the arrayed optical device K with a value close to 0 degree even if the angle of view changes, and it is therefore possible to reduce the crosstalk across the entire imaging area.

Figure 25:
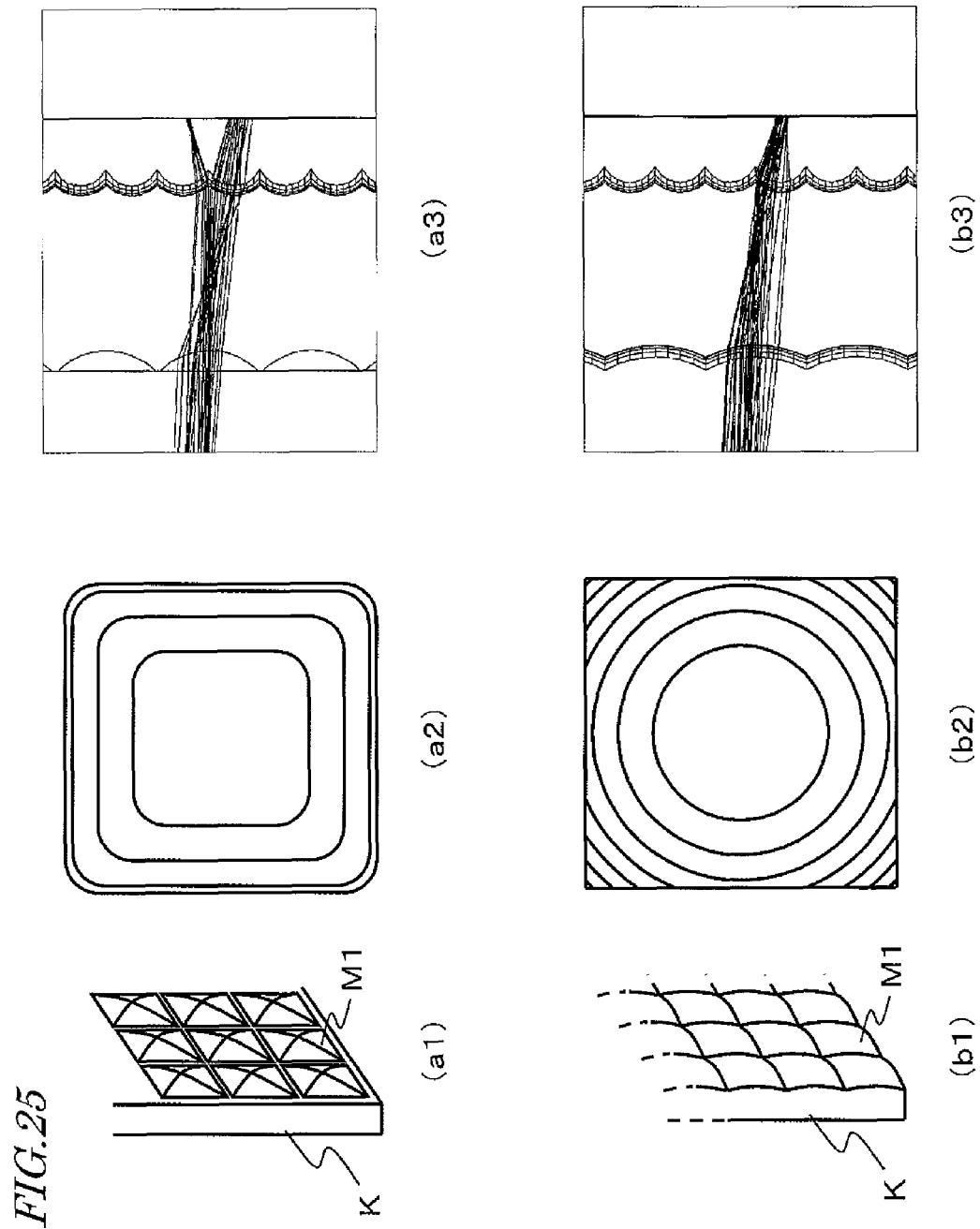
FIGS. 25 (a1) and (b1) are perspective views of the arrayed optical device K in other embodiments of the present invention, (a2) and (b2) are diagrams showing contour lines of optical elements, and (a3) and (b3) are diagrams showing the results of ray tracking simulations.

While the arrayed optical device K is a microlens array in Embodiments 3, 4 and 7 of the present invention, each microlens optical element has a shape that is rotationally symmetric with respect to the optical axis of the microlens. As a method for manufacturing a microlens, there is a method in which a resist is patterned into a rectangular shape, and the curved surface of the lens is formed by heat treatment. A perspective view of such microlenses is as shown in FIG. 25(a1). The contour lines of the microlens of FIG. 25(a1) are as shown in FIG. 25(a2), and the radius of curvature in a vertical/horizontal direction and that in a diagonal direction are different from each other. FIG. 25(a3) shows the results of light beam tracking simulation in a case where the microlens shown in FIGS. 25(a1) and (a2) is used as the arrayed optical device of the present invention. FIG. 25(a3) only shows light beams, of all the light passing through the arrayed optical device K, that pass through one optical area. With such a microlens that is not rotationally asymmetric, light leaks to adjacent pixels, causing crosstalk. On the other hand, a perspective view of microlenses having a rotationally symmetric shape is as shown in FIG. 25(b1). The contour lines of the microlens of FIG. 25(b1) are as shown in FIG. 25(b2), and the radius of curvature in a vertical/horizontal direction and that in a diagonal direciton are equal to each other. Such microlenses having a rotationally symmetric shape can be formed by a thermal imprint or UV imprint method. FIG. 25(b3) shows the results of light beam tracking simulation in a case where the microlens shown in FIGS. 25(b1) and (b2) is used as the arrayed optical device of the present invention. FIG. 25(b3) only shows light beams, of all the light passing through the arrayed optical device K, that pass through one optical area. It can be that there is no such crosstalk as that shown in FIG. 25(a3). Thus, by making each microlens optical element in a rotationally symmetric shape, it is possible to reduce the crosstalk, thereby suppressing deterioration in color purity.

While Embodiments 5, 6 and 7 show examples in which a light-blocking area is provided in the stop at a position corresponding to the step portions in order to prevent unnecessary light passing through steps, since light beams passing through the vicinity of boundaries between different areas may cause crosstalk as described above, such a stop as shown in FIG. 16, FIG. 20 and FIG. 22 may be provided in order to prevent crosstalk even if there is no step.

The imaging device used in Embodiments 1-8 may be either a monochrome imaging device or a color imaging device. For example, when a color imaging device is used, the width of the wavelength band of light passing through at least area of the optical device L1 may be narrower than the width of the wavelength band of the color filter on the pixel at which the light beam having passed through the area arrives. Since a color imaging device is used for the imaging device, it is not necessary to provide a color filter in areas other than the at least one area of the optical device L1. With such a configuration, it is possible to obtain image information of a narrow band and to attenuate the component of the wavelength band caused by crosstalk because of the effect of the spectral transmittance characteristics of the color imaging device. Since it is not necessary to provide a color filter on the optical device L1 except for the at least one area, it is possible to reduce the cost.

Embodiments 1-8 are imaging apparatuses having the signal processing section C. An imaging apparatus of the present invention may not include such a signal processing section. In such a case, processes performed by the signal processing section C may be performed by using a PC, or the like, external to the imaging apparatus. That is, the present invention may also be implemented by a system including an imaging apparatus having the lens optical system L, the arrayed optical device K and the imaging device N, and an external signal processing device.

INDUSTRIAL APPLICABILITY

An imaging apparatus of the present invention is useful as an imaging apparatus such as a digital still camera or a digital video camera. It is also applicable to cameras for obtaining spectral images, such as on-vehicle cameras, security cameras, medical applications, e.g., endoscopes and capsule endoscopes, biometric authentication applications, microscopes, and astronomical telescopes.

REFERENCE SIGNS LIST

A Imaging apparatus
L Lens optical system
L1, L1' Optical device
L2 Lens
D1, D2, D3, D4 Optical area
S Stop
K Arrayed optical device
N Imaging device
Ni Imaging surface
Ms, Md Microlens on imaging device
M1 Optical element of arrayed optical device (lenticular)
M2 Optical element of arrayed optical device (microlens)
P1, P2, P3, P4, P Pixel on imaging device
C Signal processing section

The invention claimed is:

1. An imaging apparatus comprising:
a lens optical system including a lens and a stop;
an imaging device including at least a plurality of first pixels and a plurality of second pixels on which light having passed through the lens optical system is incident, wherein in the imaging device, the plurality of first pixels and the plurality of second pixels are arranged in rows in a row direction, and one row of the plurality of first pixels and one row of the plurality of second pixels are arranged alternating with each other in a column direction; and
an arrayed optical device arranged between the lens optical system and the imaging device, wherein:
the lens optical system further includes a plurality of optical areas;
the plurality of optical areas include a first optical area that transmits therethrough light of a first wavelength band, and a second optical area that transmits therethrough light of a second wavelength band different from the first wavelength band; and
the arrayed optical device makes light having passed through the first optical area incident on the plurality of first pixels and light having passed through the second optical area incident on the plurality of second pixels.

2. An imaging apparatus comprising:
a lens optical system including a lens and a stop;
an imaging device including at least a plurality of first pixels, a plurality of second pixels and a plurality of third pixels on which light having passed through the lens optical system is incident, wherein in the imaging device, the plurality of first pixels, the plurality of second pixels and the plurality of third pixels are arranged in rows in a row direction, and one row of the plurality of first pixels, one row of the plurality of second pixels and one row of the plurality of third pixels are arranged alternating with one another in this order in a column direction; and
an arrayed optical device arranged between the lens optical system and the imaging device, wherein:
the lens optical system further includes a plurality of optical areas;
the plurality of optical areas include a first optical area that transmits therethrough light of a first wavelength band, a second optical area that transmits therethrough light of a second wavelength band different from the first wavelength band and a third optical area that transmits therethrough light of a third wavelength band different from the first wavelength band and the second wavelength band; and
the arrayed optical device makes light having passed through the first optical area incident on the plurality of first pixels, light having passed through the second optical area incident on the plurality of second pixels and light having passed through the third optical area incident on the plurality of third pixels.

3. An imaging apparatus comprising:
a lens optical system including a lens and a stop;
an imaging device including at least a plurality of first pixels, a plurality of second pixels, a plurality of third pixels and a plurality of fourth pixels on which light having passed through the lens optical system is incident, wherein in the imaging device, the plurality of first pixels, the plurality of second pixels, the plurality of third pixels and the plurality of fourth pixels form four pixels which are arranged adjacent to one another in a matrix pattern of two rows and two columns, and the four pixels are repeatedly arranged in a row direction and in a column direction; and
an arrayed optical device arranged between the lens optical system and the imaging device, wherein:
the lens optical system further includes a plurality of optical areas;
the plurality of optical areas include a first optical area that transmits therethrough light of a first wavelength band, a second optical area that transmits therethrough light of a second wavelength band different from the first wavelength band, a third optical area that transmits therethrough light of a third wavelength band different from the first wavelength band and the second wavelength band and a fourth optical area that transmits therethrough light of a fourth wavelength band different from the first wavelength band, the second wavelength band and the third wavelength band; and
the arrayed optical device makes light having passed through the first optical area incident on the plurality of first pixels, light having passed through the second optical area incident on the plurality of second pixels, light having passed through the third optical area incident on the plurality of third pixels and light having passed through the fourth optical area incident on the plurality of fourth pixels.

4. The imaging apparatus according to claim 1, wherein the arrayed optical device is a lenticular lens in which a plurality of optical elements elongated in a row direction are arranged in a column direction,
the plurality of optical elements are arranged so that each optical element thereof corresponds to two rows of pixels including one row of the plurality of first pixels and one row of the plurality of second pixels.

5. The imaging apparatus according to claim 2, wherein the arrayed optical device is a lenticular lens in which a plurality of optical elements elongated in a row direction are arranged in a column direction,
the plurality of optical elements are arranged so that each optical element thereof corresponds to three rows of pixels including one row of the plurality of first pixels, one row of the plurality of second pixels and one row of the plurality of third pixels.

6. The imaging apparatus according to claim 3, wherein the arrayed optical device is a microlens in which a plurality of optical elements are arranged in a lattice pattern, the plurality of optical elements are arranged so that each optical element thereof corresponds to the four pixels.

7. The imaging apparatus according to claim 1, wherein the first optical area and the second optical area are arranged in a column direction and in the vicinity of the stop.

8. The imaging apparatus according to claim 2, wherein the first optical area, the second optical area and the third optical area are arranged in a column direction and in the vicinity of the stop.

9. The imaging apparatus according to claim 3, wherein the first optical area, the second optical area, the third optical area and the fourth optical area are arranged in a matrix pattern and in the vicinity of the stop.

10. The imaging apparatus according to claim 1, wherein the light of the first wavelength band is near infrared light, and the light of the second wavelength band is visible light.

11. The imaging apparatus according to claim 1, wherein the light of the first wavelength band is near ultraviolet light, and the light of the second wavelength band is visible light.

12. The imaging apparatus according to claim 1, wherein a width of the second wavelength band is narrower than a width of the first wavelength band.

13. The imaging apparatus according to claim 2, wherein the light of the first wavelength band is blue light, the light of the second wavelength band is green light and the light of the third wavelength band is red light.

14. The imaging apparatus according to claim 3, wherein the light of the first wavelength band is blue light, the light of the second wavelength band is green light, the light of the third wavelength band is red light and the light of the fourth wavelength band is near infrared light.

15. The imaging apparatus according to claim 3, wherein the light of the first wavelength band is blue light, the light of the second wavelength band is green light, the light of the third wavelength band is red light and the light of the fourth wavelength band is near ultraviolet light.

16. The imaging apparatus according to claim 1, wherein the first and second optical areas of the lens optical system is each formed by a plurality of optical areas separated from each other with the optical axis interposed therebetween.

17. The imaging apparatus according to claim 1, wherein:
the first optical area and the second optical area have different levels of optical power;
a focus position of light passing through the first optical area and a focus position of light passing through the second optical area are closer to each other as compared with a case where the first optical area and the second optical area have an equal level of optical power.

18. The imaging apparatus according to claim 1, further comprising:
a microlens provided between the arrayed optical device and the imaging device,
wherein the arrayed optical device is formed on the imaging device with the microlens interposed therebetween.

19. The imaging apparatus according to claim 1, wherein:
the imaging device is a color imaging device with a color filter formed on each pixel; and
a width of a wavelength band of at least one optical area of the plurality of optical areas is narrower than a width of a wavelength band of a color filter on the color imaging device at which a light beam having passed through the at least one optical area arrives.

20. The imaging apparatus according to claim 1, further comprising:
a signal processing section,
wherein the signal processing section generates first image information corresponding to the first wavelength band from pixel values obtained from the plurality of first pixels, and generates second image information corresponding to the second wavelength band from pixel values obtained from the plurality of second pixels.

21. An imaging system comprising:
the imaging apparatus according to claim 1; and
a signal processing device for generating first image information corresponding to the first wavelength band from pixel values obtained from the plurality of first pixels of the imaging apparatus, and generating second image information corresponding to the second wavelength band from pixel values obtained from the plurality of second pixels.

* * * * *